United States Patent
Yukinobu et al.

(10) Patent No.: US 10,283,230 B2
(45) Date of Patent: May 7, 2019

(54) PRODUCTION METHOD FOR COATING LIQUID FOR FORMATION OF TRANSPARENT CONDUCTIVE FILM

(71) Applicant: SUMITOMO METAL MINING CO., LTD., Tokyo (JP)

(72) Inventors: Masaya Yukinobu, Ichikawa (JP); Yoshihiro Otsuka, Ichikawa (JP); Yuki Murayama, Ichikawa (JP)

(73) Assignee: Sumitomo Metal Mining Co., Ltd. (JP)

( * ) Notice: Subject to any disclaimer, the term of this patent is extended or adjusted under 35 U.S.C. 154(b) by 228 days.

(21) Appl. No.: 14/392,006

(22) PCT Filed: Aug. 9, 2013

(86) PCT No.: PCT/JP2013/071989
§ 371 (c)(1),
(2) Date: Jan. 14, 2015

(87) PCT Pub. No.: WO2014/034439
PCT Pub. Date: Mar. 6, 2014

(65) Prior Publication Data
US 2015/0232674 A1   Aug. 20, 2015

(30) Foreign Application Priority Data

Aug. 29, 2012   (JP) ................. 2012-189072
Apr. 24, 2013   (JP) ................. 2013-091817
Jun. 24, 2013   (JP) ................. 2013-131795

(51) Int. Cl.
| | |
|---|---|
| *H01B 1/20* | (2006.01) |
| *B05D 5/12* | (2006.01) |
| *C03C 17/27* | (2006.01) |
| *C08K 5/00* | (2006.01) |
| *C08K 5/09* | (2006.01) |
| *C09D 101/08* | (2006.01) |
| *C09D 5/24* | (2006.01) |
| *C09D 7/20* | (2018.01) |
| *C09D 7/40* | (2018.01) |
| *C09D 7/61* | (2018.01) |
| *C23C 18/12* | (2006.01) |
| *H01L 31/0224* | (2006.01) |
| *H01B 1/08* | (2006.01) |
| *C09D 1/00* | (2006.01) |
| *H01L 31/18* | (2006.01) |

(52) U.S. Cl.
CPC ............... *H01B 1/20* (2013.01); *B05D 5/12* (2013.01); *C03C 17/27* (2013.01); *C09D 1/00* (2013.01); *C09D 5/24* (2013.01); *C09D 7/20* (2018.01); *C09D 7/40* (2018.01); *C09D 7/61* (2018.01); *C09D 101/08* (2013.01); *C23C 18/1216* (2013.01); *C23C 18/1279* (2013.01); *C23C 18/1283* (2013.01); *H01B 1/08* (2013.01); *H01L 31/022475* (2013.01); *H01L 31/1884* (2013.01); *C03C 2217/231* (2013.01); *C03C 2217/948* (2013.01); *C08K 5/0091* (2013.01); *C08K 5/09* (2013.01); *Y02E 10/50* (2013.01)

(58) Field of Classification Search
CPC ... H01B 1/08; H01B 1/20; H01B 1/22; C09D 5/24; C09D 7/001; C09D 7/002; C09D 7/1233; C09D 7/125; C09D 7/14; C09D 101/10; C09D 101/02; C09D 101/04; C09D 101/06; C09D 101/08; C05D 11/52; C05D 11/101; C23C 18/1216; C23C 18/1279; C23C 18/1283; C23C 18/14; B05D 5/12; H01L 31/022466; H01L 31/022475; H01L 31/1884; H01L 33/42; C03C 17/27; C03C 2217/231; C03C 2217/948; C08K 5/0091; C08K 5/09
USPC ....... 252/518.1, 519.1, 519.2, 519.21, 520.1; 257/43; 427/126.3; 428/702
See application file for complete search history.

(56) References Cited

U.S. PATENT DOCUMENTS

| | | | |
|---|---|---|---|
| 4,420,500 A | 12/1983 | Nakatani et al. | |
| 8,039,065 B2 * | 10/2011 | Ikeda | G02B 1/111 349/137 |

(Continued)

FOREIGN PATENT DOCUMENTS

| | | |
|---|---|---|
| JP | 57-36714 | 2/1982 |
| JP | 57-138708 | 8/1982 |

(Continued)

OTHER PUBLICATIONS

English machine translation of IDS reference JP 6-203658 (1994).*

(Continued)

*Primary Examiner* — Mark Kopec
*Assistant Examiner* — Matthew R Diaz
(74) *Attorney, Agent, or Firm* — Gerald E. Hespos; Michael J. Porco; Matthew T. Hespos

(57) ABSTRACT

Provided is a method for producing a coating liquid for forming a transparent conductive film, capable of forming a transparent conductive film having excellent transparency and electrical conductivity using a wet-coating method. Disclosed is the method for producing a coating liquid for forming a transparent conductive film, the method including a heating and dissolution step and a dilution step, in which the conditions for heating and dissolution/reaction of the heating and dissolution step are such that the heating temperature is in the range of 130° C.$\leq$T$\leq$180° C., and the heating time is in the range shown in FIG. 1.

17 Claims, 5 Drawing Sheets

(56) References Cited

U.S. PATENT DOCUMENTS

| | | | | |
|---|---|---|---|---|
| 2010/0184253 A1* | 7/2010 | Hirai | ............... | H01L 29/7869 |
| | | | | 438/104 |
| 2011/0229737 A1 | 9/2011 | Yukinobu et al. | | |
| 2012/0223302 A1* | 9/2012 | Yukinobu | ............... | C09D 1/00 |
| | | | | 257/43 |
| 2012/0313055 A1* | 12/2012 | Yukinobu | ............... | C09D 5/24 |
| | | | | 252/519.5 |
| 2013/0101867 A1* | 4/2013 | Yukinobu | ............ | C03C 17/006 |
| | | | | 428/702 |

FOREIGN PATENT DOCUMENTS

| | | | | |
|---|---|---|---|---|
| JP | 57-212268 | 12/1982 | | |
| JP | 61-26679 | 2/1986 | | |
| JP | 63-19046 | 4/1988 | | |
| JP | 63-25448 | 5/1988 | | |
| JP | 2-20706 | 5/1990 | | |
| JP | 4-255768 | 9/1992 | | |
| JP | 6-203658 | 7/1994 | | |
| JP | 2006-49019 | 2/2006 | | |
| JP | WO 2011055856 A1 * | 5/2011 | ............... | C09D 1/00 |
| JP | WO 2011155635 A1 * | 12/2011 | ........... | C03C 17/006 |
| WO | WO 2010/064719 | 6/2010 | | |

OTHER PUBLICATIONS

English machine translation of IDS reference JP 2006-049019 (2006).*

International Search Report dated Sep. 12, 2013.

* cited by examiner

PRODUCTION METHOD FOR COATING LIQUID FOR FORMATION OF TRANSPARENT CONDUCTIVE FILM

BACKGROUND

1. Field of the Invention

The present invention relates to a method for producing a coating liquid for forming a transparent conductive film. More particularly, the present invention relates to a method for producing a coating liquid for forming a transparent conductive film, by which the coating liquid for forming a transparent conductive film capable of forming a transparent conductive film having both transparency and high electrical conductivity on a heat resistant substrate such as a glass substrate or a ceramic substrate using a wet-coating method, particularly a spin coating method or a dip coating method, can be prepared conveniently at low cost with a stabilized product quality.

2. Description of the Related Art

A known example of a material for forming a transparent conductive film that is used in transparent electrodes for display elements such as liquid crystal displays, electroluminescent displays and plasma displays; transparent electrodes for touch panels and solar cells; and functional coatings for heat ray reflection, electromagnetic wave shielding, static elimination, antifogging, and the like, is tin-doped indium oxide (hereinafter, may be indicated as "ITO").

Regarding the method for producing a transparent conductive film (ITO film), physical techniques such as a vacuum deposition method, a sputtering method, and a chemical vapor deposition method have been widely used. These methods can form a uniform transparent conductive film (ITO film) having excellent transparency and electrical conductivity on a substrate. However, the film forming apparatus used for this purpose is very expensive because the apparatus is based on a vacuum container, and since the component gas pressures inside the production apparatus should be precisely controlled for each and every film forming on a substrate, there is a problem with production cost and mass productivity.

Regarding the production method for solving the problems described above, investigations have been conducted on a method of using a coating liquid for forming a transparent conductive film, which is prepared by dissolving an indium compound and a tin compound in a solvent, and applying the coating liquid on a substrate (hereinafter, may be described as a "wet-coating method"). In this method, a transparent conductive film (ITO film) is formed through simple production processes of applying a coating liquid for forming a transparent conductive film on a substrate, drying, and baking.

Examples of this method of coating a coating liquid on a substrate include a spin coating method, a dip coating method, a spray coating method, a screen printing method, and a wire bar coating method. Furthermore, in the case of applying the coating liquid on an external surface or an internal surface of a substrate having a bent surface or a pipe, a dip coating method or a spray coating method can be applied.

In regard to the wet-coating method described above, various coating liquids have been hitherto developed as the coating liquid containing an indium compound and a tin compound, and for example, Japanese Unexamined Patent Application Publication No. 57-138708 discloses a mixture of indium nitrate and alkyl tin nitrate, containing halogen ions or a carboxyl group; Japanese Unexamined Patent Application Publication No. 61-26679 discloses a mixture of an organoindium compound and an organotin compound, containing an alkoxy group or the like; Japanese Unexamined Patent Application Publication No. 4-255768 discloses a mixture of indium nitrate and an organotin compound; Japanese Unexamined Patent Application Publication No. 57-36714 discloses an inorganic compound mixture of indium nitrate, tin nitrate, and the like; Japanese Unexamined Patent Application Publication No. 57-212268 discloses a mixture of an organoindium nitrate such as dicarboxylate indium nitrate, and an organotin nitrate such as alkyl tin nitrate; Japanese Examined Patent Publication No. 63-25448 discloses an organic compound mixture solution made of an organoindium complex and a tin complex with coordination of acetylacetonate; Japanese Examined Patent Publication No. 2-20706 discloses an organic compound mixed solution such as described above; and Japanese Examined Patent Publication No. 63-19046 discloses the same organic compound mixture. However, as revealed from these patent documents, most of the conventional coating liquids use nitrates of indium or tin, organic or inorganic compounds formed from halides, organometallic compounds such as metal alkoxides, and others.

However, a coating liquid which uses a nitrate or a halide generates corrosive gases such as nitrogen oxides or chlorine at the time of baking, and therefore, there is a problem that the coating liquid causes facility corrosion or environmental pollution. Furthermore, a coating liquid which uses a metal alkoxide has a problem with stability of the coating liquid because the raw material is prone to hydrolytic degradation. Moreover, most of the coating liquids using organometallic compounds as described in the patent documents described above also have a problem that the coating liquids have poor wettability to substrate, and are prone to form non-uniform films.

Japanese Unexamined Patent Application Publication No. 6-203658 that has been suggested by the applicant of the present invention discloses, as a coating liquid that has ameliorated these problems, a coating liquid for forming a transparent conductive film which contains indium acetylacetonate (standard nomenclature: tris(acetylacetonato)indium; In(C5H7O2)3), tin acetylacetonate (standard nomenclature: di-n-butyl bis(2,4-pentanedionato)tin); [Sn(C4H9)2 (C5H7O2)2]), hydroxypropylcellulose, alkylphenol and/or alkenylphenol, and a dibasic acid ester and/or benzyl acetate.

In regard to this coating liquid, by containing hydroxypropylcellulose into a mixed solution of indium acetylacetonate and tin acetylacetonate, wettability of the coating liquid to a substrate is improved. At the same time, the viscosity of the coating liquid can be adjusted based on the content of hydroxypropylcellulose as a viscosity-adjusting agent, so that various wet-coating methods such as spin coating, spray coating, dip coating, screen printing, and wire bar coating can be employed.

Furthermore, WO 2010/064719 A1 that was filed by the same applicant discloses that in regard to a transparent conductive film (ITO film) obtainable by applying, drying and baking the coating liquid for forming a transparent conductive film described in Japanese Unexamined Patent Application Publication No. 6-203658, which contains indium acetylacetonate, tin acetylacetonate, hydroxypropylcellulose, an alkylphenol and a dibasic acid ester, when an air atmosphere with a low humidity (for example, the dew point temperature is −10° C. or lower, and more preferably −20° C. or lower) is used at the time of baking, the transparent conductive film is densified, and transparency, electrical conductivity, and film strength can be enhanced.

Therefore, when conventional atmosphere is used for the atmosphere at the time of baking, the dew point temperature is as high as, for example, about 10° C. to 23° C. during summer (under an assumption that the air temperature is about 25° C., and the relative humidity is 40% to 90%), and is as low as about −23° C. to −10° C. during winter (under an assumption that the air temperature is about 5° C., and the relative humidity is 10% to 30%), and thus it is difficult to obtain a dense transparent conductive film (ITO film) in summer season in which the dew point temperature is higher.

In fact, there has been recognized a clear tendency that in regard to the formation of a transparent conductive film (ITO film) using the suggested coating liquid for forming a transparent conductive film, when a low humidity atmosphere of winter season is used as the atmosphere at the time of baking, a high quality transparent conductive film that is relatively dense may be obtained; however, when a high humidity atmosphere of summer season is used, only a low quality transparent conductive film having not very favorable denseness is obtained. Particularly, in the case of using a high humidity atmosphere of summer season is used as the atmosphere at the time of baking, it is considered that due to the fluctuations in the product quality of the coating liquid for forming a transparent conductive film, which occur as a result of the differences in the production conditions for the coating liquid for forming a transparent conductive film, and the like, denseness of the transparent conductive film thus obtainable also fluctuates to a large extent. Thus, there is a demand for a method for producing a coating liquid for forming a transparent conductive film having a more stable product quality.

Meanwhile, due to the fluctuations in denseness, the film structure of the transparent conductive film thus obtainable varies from a dense film having conductive oxide fine particles (usually, particle size: several nanometers (nm) to several ten nanometers (nm)) such as ITO densely packed therein and having a small number of small vacancies (pores), to a loose film (porous film) having conductive oxide fine particles loosely packed therein and having a large number of large vacancies (pores). Further, the dense film can realize a high performance transparent conductive film having high transparency (a smaller haze value), low resistance, excellent resistance stability with time, and high film strength, as compared with the loose film (porous film).

Here, the transparency is generally evaluated based on the degree of scattering (haze or a haze value) of visible light (light rays having a wavelength of 380 nm to 780 nm) in a transparent conductive film, and it may be said that a smaller haze is directed to higher transparency.

Furthermore, in regard to a film structure in which conductive oxide fine particles such as described above are packed, it is known that since light rays in the shorter wavelength region (blue) of visible light are highly susceptible to scattering as compared with light rays in the medium wavelength region (green) to long wavelength region (red) (since Rayleigh scattering is likely to occur), as the transparent conductive film becomes looser, the degree of scattering of blue color (hereinafter, referred to as a "blue haze") increases. In addition, the short wavelength region (blue) refers to, among the short wavelength regions of visible light, a wavelength region near the wavelength of 450 nm at which the color perception response (response by which human eyes can perceive color efficiently) is strong.

The blue haze is more prominently perceived to become more obvious when intense visible light (for example, solar light) is irradiated to a transparent conductive film. Therefore, even if the haze value of visible light is relatively small, the blue haze value may be large (on the contrary, the case, in which the haze of visible light is large at a relatively smaller value of the blue haze, is not valid). Particularly, a coating liquid for forming a high quality transparent conductive film, in which the haze of visible light can originally decrease the blue haze even in summer season where the humidity of the atmosphere is high (the dew point temperature is high), and it is difficult to obtain a dense transparent conductive film, is desired.

Furthermore, in regard to the fluctuations in the product quality of a coating liquid for forming a transparent conductive film, which occur from the differences in the production conditions for the coating liquid for forming a transparent conductive film and the like, apart from the problem of denseness of the transparent conductive film thus obtainable, the viscosity of the coating liquid for forming a transparent conductive film increases with time, and in the worst case, the coating liquid may gelate (purinate) over a time period of several days to several months. Thus, it is also desired to solve the problem.

Furthermore, from the viewpoint of reducing the cost for the coating liquid for forming a transparent conductive film, it is desirable to produce the coating liquid for forming a transparent conductive film more conveniently for a short time.

However, in Japanese Unexamined Patent Application Publication No. 6-203658 and WO 2010/064719 A1, there have been suggested production methods of heating and stirring a solution, obtained by dissolving components such as indium acetylacetonate or hydroxypropylcellulose in an organic solvent, at 60° C. to 200° C. for 0.5 hr to 12 hr; however, the production conditions vary widely, and Examples thereof merely disclose production conditions for heating at 160° C. for 1 hr (Japanese Unexamined Patent Application Publication No. 6-203658), or heating at 130° C. for 1.5 hr (WO 2010/064719 A1), so that the production conditions are very limited. Thus, even from the viewpoints of stabilization of the product quality of the coating liquid for forming a transparent conductive film and cost reduction, it is the current situation that there is a demand for a more adequate production method.

An object of the present invention is to provide a method for producing a coating liquid for forming a transparent conductive film, by which a coating liquid for forming a transparent conductive film, capable of forming a transparent conductive film having both transparency and high electrical conductivity by a wet-coating method such as a spin coating method or a dip coating method, can be produced conveniently at low cost with a stabilized product quality.

SUMMARY OF THE INVENTION

In order to achieve the object described above, the inventors conducted thorough investigations on a method for producing a coating liquid for forming a transparent conductive film containing indium acetylacetonate as an organoindium compound; a dopant organometallic compound; a cellulose derivative (such as hydroxypropylcellulose) as an organic viscosity-adjusting agent; an alkylphenol as a high boiling point organic solvent (boiling point: 180°

C. or higher); and a dibasic acid ester. As a result, the inventors found that in regard to a heating and dissolution step of heating and dissolving the indium acetylacetonate, dopant organometallic compound, and cellulose derivative in a high boiling point organic solvent (boiling point: 180° C. or higher) containing at least an alkylphenol and a dibasic acid ester to allow the compounds to react, and thereby obtaining a highly concentrated solution, when the heating temperature and the heating time as the conditions for heating and dissolution/reaction are set to particular ranges, a coating liquid for forming a transparent conductive film capable of forming a transparent conductive film having both transparency and high electrical conductivity can be produced conveniently at low cost with a stabilized product quality by a wet-coating method such as a spin coating method or a dip coating method. Thus, the inventors completed the present invention.

That is, a first aspect of the present invention to achieve the object described above relates to a method for producing a coating liquid for forming a transparent conductive film. The method includes various steps of a heating and dissolution step of heating and dissolving an organoindium compound, a dopant organometallic compound, and an organic viscosity-adjusting agent in a high boiling point organic solvent (boiling point: 180° C. or higher) while stirring, to allow the compounds to react, and thereby obtaining a highly concentrated solution; and a dilution step of diluting the highly concentrated solution obtained in the heating and dissolution step with any one or more of a medium boiling point organic solvent (boiling point: higher than or equal to 100° C. and lower than 180° C.) and a low boiling point organic solvent (boiling point: higher than or equal to 50° C. and lower than 100° C.), wherein the total content of the organoindium compound and the dopant organometallic compound in the highly concentrated solution is 20% to 60% by weight; the content of the organic viscosity-adjusting agent is 1/20 to 1/3 of the total content (by weight) of the organoindium compound and the dopant organometallic compound; the organoindium compound is indium acetylacetonate; the organic viscosity-adjusting agent is a cellulose derivative; the high boiling point organic solvent (boiling point: 180° C. or higher) is a high boiling point organic solvent (boiling point: 180° C. or higher) containing at least an alkylphenol and a dibasic acid ester; the any one or more organic solvents selected from a medium boiling point organic solvent (boiling point: higher than or equal to 100° C. and lower than 180° C.) and a low boiling point organic solvent (boiling point: higher than or equal to 50° C. and lower than 100° C.) is a ketone-based organic solvent; and the conditions for heating and dissolution/reaction of the heating and dissolution step are such that the heating temperature (T: ° C.) is in the range of 130° C.≤T≤180° C., and the heating time (L: hr) is in the range of −0.7T+104<L<−1.1T+168 (130° C.≤T<140° C.), −0.3T+48<L<−0.6T+98 (140° C.≤T<150° C.), −0.15T+25.5<L<−0.4T+68 (150° C.≤T<160° C.), −0.1T+17.5<L<−0.2T+36 (160° C.≤T<170° C.), or −0.025T+4.75<L<−0.1T+19 (170° C.≤T≤180° C.).

The invention also relates to a method for producing a coating liquid for forming a transparent conductive film that includes various steps of a heating and dissolution step of heating and dissolving an organoindium compound, a dopant organometallic compound and an organic viscosity-adjusting agent in a high boiling point organic solvent (boiling point: 180° C. or higher) while stirring, to allow the compounds to react, and thereby obtaining a highly concentrated solution; and a dilution step of diluting the highly concentrated solution obtained in the heating and dissolution step using any one or more of a medium boiling point organic solvent (boiling point: higher than or equal to 100° C. and lower than 180° C.) and a low boiling point organic solvent (boiling point: higher than or equal to 50° C. and lower than 100° C.), wherein the total content of the organoindium compound and the dopant organometallic compound in the highly concentrated solution is 20% to 60% by weight; the content of the organic viscosity-adjusting agent is 1/20 to 1/3 of the total content (by weight) of the organoindium compound and the dopant organometallic compound; the organoindium compound is indium acetylacetonate; the organic viscosity-adjusting agent is a cellulose derivative; the high boiling point organic solvent (boiling point: 180° C. or higher) is a high boiling point organic solvent (boiling point: 180° C. or higher) containing at least an alkylphenol and a dibasic acid ester; the any one or more organic solvents selected from a medium boiling point organic solvent (boiling point: higher than or equal to 100° C. and lower than 180° C.) and a low boiling point organic solvent (boiling point: higher than or equal to 50° C. and lower than 100° C.) is a ketone-based organic solvent; the heating temperature (T: ° C.) of the conditions for heating and dissolution/reaction of the heating and dissolution step is in the range of 130° C.≤T≤180° C., while the heating time (L: hr) satisfies the following Equation (1); and the degree of viscosity change in a case in which the coating liquid for forming a transparent conductive film is left to stand for three months at room temperature is regulated to be from 0.5 times to 1.5 times (±50% or less) the initial viscosity.

[Equation 1]

$$L > \begin{cases} -0.7\ T + 104 & (130 \leq T < 140°\ \mathrm{C.}) \\ -0.3\ T + 48 & (140 \leq T < 150°\ \mathrm{C.}) \\ -0.15\ T + 25.5 & (150 \leq T < 160°\ \mathrm{C.}) \\ -0.1\ T + 17.5 & (160 \leq T < 170°\ \mathrm{C.}) \\ -0.025\ T + 4.75 & (170 \leq T \leq 180°\ \mathrm{C.}) \end{cases} \quad (1)$$

The content ratio of the organoindium compound and the dopant organometallic compound may be such that the molar ratio of organoindium compound/dopant organometallic compound is 99/1 to 87/13.

The total content of the organoindium compound and the dopant organometallic compound in the coating liquid for forming a transparent conductive film may be 5% to 15% by weight.

The dopant organometallic compound is tin acetylacetonate.

The cellulose derivative may be hydroxypropylcellulose.

The alkylphenol may be para-tertiary butylphenol (boiling point: 237° C.)

The dibasic acid ester may be any one or more of dimethyl malonate (boiling point: 181° C. to 183° C.), dimethyl succinate (boiling point: 196° C.), dimethyl glutarate (boiling point: 210° C. to 215° C.), and dimethyl adipate (boiling point: 215° C. to 225° C.).

The ketone-based organic solvent may be any one or more of cyclohexanone (boiling point: 155.7° C.) and methyl ethyl ketone (boiling point: 79.6° C.).

The present invention also relates to a coating liquid for forming a transparent conductive film obtainable by using any of the above-described method for producing a coating liquid for forming a transparent conductive film according to the first to ninth aspects.

According to the method for producing a coating liquid for forming a transparent conductive film of the present invention, a coating liquid for forming a transparent conductive film capable of forming a transparent conductive film having transparency and high electrical conductivity on a heat-resistant substrate made of glass or ceramic using a wet-coating method, particularly a spin coating method or a dip coating method, can be produced conveniently at low cost with a stabilized product quality.

Furthermore, a transparent conductive film formed on a substrate using a coating liquid for forming a transparent conductive film, which is obtainable by the method for producing a coating liquid for forming a transparent conductive film of the present invention, using a wet-coating method such as a spin coating method or a dip coating method, has both transparency and high electrical conductivity and is inexpensive, and therefore, the transparent conductive film can be expected to be utilized in display element transparent electrodes for various displays, and transparent electrodes for touch panels, solar cells, field emission lamps and the like.

DETAILED DESCRIPTION OF THE EMBODIMENTS

Figure 1:
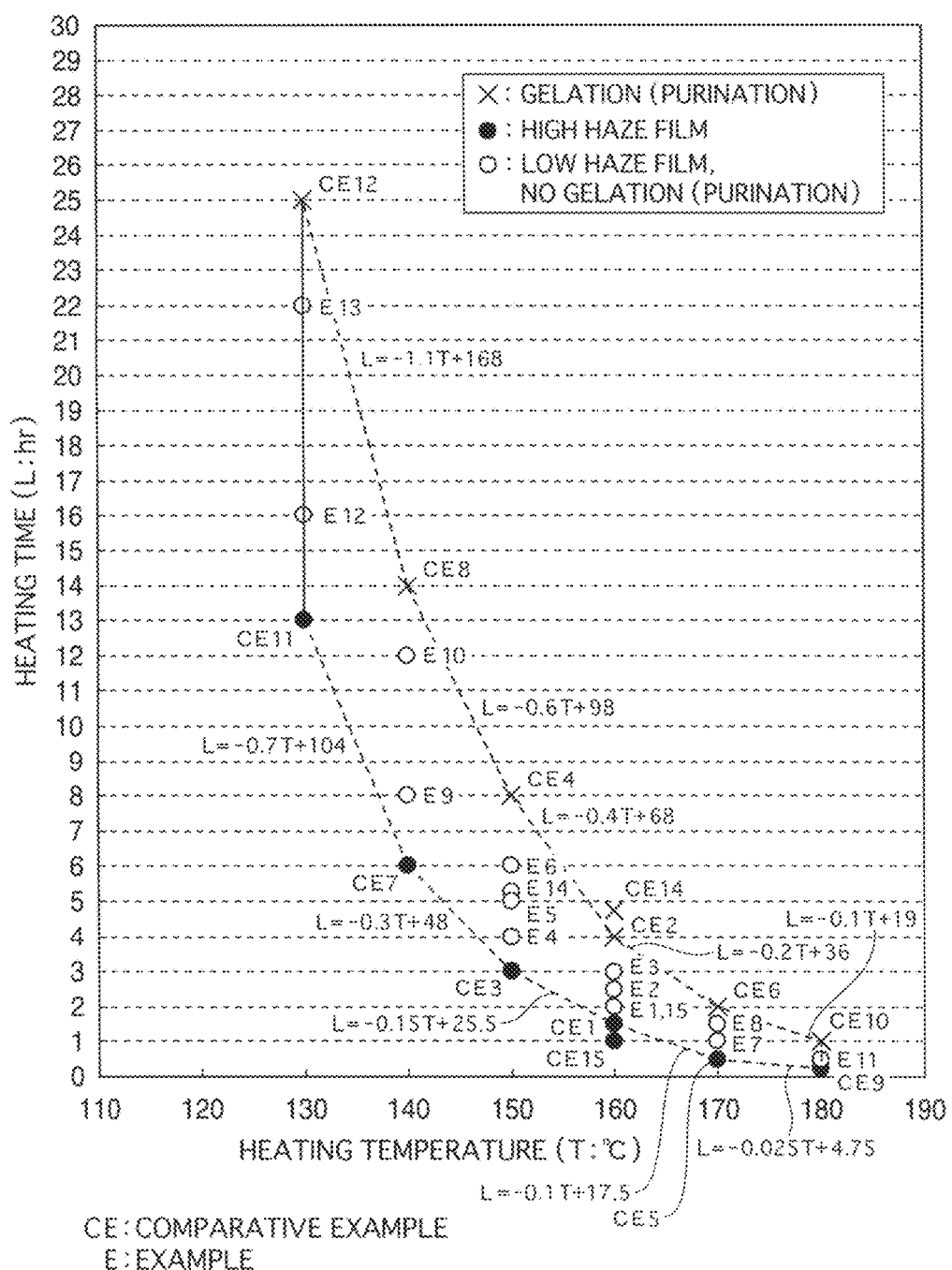
FIG. 1 is a diagram illustrating the relation between conditions for heating and dissolution/reaction (heating temperature (T: ° C.) and heating time (L: hr)) of heating and dissolution step in a method for producing a coating liquid for forming a transparent conductive film according to the present invention, and a quality status of the coating liquid for forming a transparent conductive film.

Hereinafter, exemplary embodiments of the present invention will be described in detail.

In the present invention, a coating liquid for forming a transparent conductive film is produced by a heating and dissolution step of heating and dissolving an organoindium compound, a dopant organometallic compound, and an organic viscosity-adjusting agent in a high boiling point organic solvent (boiling point: 180° C. or higher) while stirring, to allow the compounds to react, and thereby obtaining a highly concentrated solution; and a dilution step of diluting the highly concentrated solution obtained in the heating and dissolution step with any one or more of a medium boiling point organic solvent (boiling point: higher than or equal to 100° C. and lower than 180° C.) and a low boiling point organic solvent (boiling point: higher than or equal to 50° C. and lower than 100° C.), and thus, an inexpensive and convenient production method for a high quality coating liquid for forming a transparent conductive film is made feasible by setting the heating temperature and the heating time in the heating and dissolution step to particular ranges.

First, indium acetylacetonate (standard nomenclature: tris (acetylacetonato)indium) [In($C_5H_7O_2$)$_3$] (hereinafter, may be described as AcAcIn) is used as the organoindium compound. Indium acetylacetonate is preferable because this compound is highly soluble in organic solvents, and is thermally decomposed and burnt (oxidized) in an atmosphere at a temperature of about 200° C. to 250° C. to become an oxide.

Next, the dopant organometallic compound is preferably any one or more of an organotin compound, an organotitanium compound, an organogermanium compound, an organozinc compound, an organotungsten compound, an organozirconium compound, an organotantalum compound, an organoniobium compound, an organohafnium compound, and an organovanadium compound, and among these, an organotin compound is more preferred.

Examples of the organotin compound (the valence of tin in the compound may be divalent or tetravalent) as the dopant organometallic compound include tin acetylacetonate (standard nomenclature: di-n-butyl bis(2,4-pentanedionato)tin) [Sn($C_4H_9$)$_2$($C_5H_7O_2$)$_2$] (hereinafter, may be described as AcAcSn), tin octylate, tin 2-ethylhexanoate, tin acetate(II) [Sn($CH_3COO$)$_2$], tin acetate(IV) [Sn($CH_3COO$)$_4$], di-n-butyltin diacetate [Sn($C_4H_9$)$_2$($CH_3COO$)$_2$], tin formate, and tin tert-butoxide [Sn($C_4H_9O$)$_4$] as a tin alkoxide. However, basically, any organotin compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used. Among these, tin acetylacetonate is preferred because the compound is easily available at relatively low cost.

Examples of the organotitanium compound as the dopant organometallic compound include titanium acetylacetonate (standard nomenclature: titanium di-n-butoxide bis(2,4-pentanedionate) [Ti($C_4H_9O$)$_2$($C_5H_7O_2$)$_2$], titanyl(IV) acetylacetonate [(C$_5$H$_7$O$_2$)$_4$TiO], and titanium diisopropoxide bis(2,4-pentanedionate) [C$_{16}$H$_{36}$O$_4$Ti] as titanium acetylacetone complexes; and titanium tetraethoxide [Ti(C$_2$H$_5$O)$_4$], titanium(IV) tetra-n-butoxide [Ti(C$_4$H$_9$O)$_4$], titanium tetra-n-butoxide [Ti(C$_4$H$_9$O)$_4$], and titanium tetraisopropoxide [Ti(C$_3$H$_7$O)$_4$] as titanium alkoxides. However, basically, any organotitanium compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used. Among these, titanium acetylacetonate, titanium tetra-n-butoxide, and titanium tetraisopropoxide are preferred because these compounds are easily available at relatively low cost.

Examples of the organogermanium compound as the dopant organometallic compound include germanium tetraethoxide [Ge(C$_2$H$_5$O)$_4$], germanium tetra-n-butoxide [Ge(C$_4$H$_9$O)$_4$], and germanium tetraisopropoxide [Ge(C$_3$H$_7$O)$_4$] as germanium alkoxides; and β-carboxyethylgermanium oxide [(GeCH$_2$CH$_2$COOH)$_2$O$_3$], tetraethylgermanium [Ge(C$_2$H$_5$)$_4$], tetrabutylgermanium [Ge(C$_4$H$_9$)$_4$], and tributylgermanium [Ge(C$_4$H$_9$)$_3$]. However, basically, any organogermanium compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used.

Among these, germanium tetraethoxide, germanium tetra-n-butoxide, and germanium tetraisopropoxide are preferred because these compounds are easily available at relatively low cost.

Examples of the organozinc compound as the dopant organometallic compound include zinc acetylacetonate (standard nomenclature: zinc-2,4-pentanedionate) [Zn(C5H7O2)2] and zinc-2,2,6,6-tetramethyl-3,5-heptanedionate [Zn(C11H19O2)2] as zinc acetylacetone complexes. However, basically, any organozinc compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used. Among these, zinc acetylacetonate is preferred because the compound is easily available at low cost.

Examples of the organotungsten compound as the dopant organometallic compound include tungsten(V) ethoxide [W(C2H5O)5] and tungsten(VI) ethoxide [W(C2H5O)6] as tungsten alkoxides. However, basically, any organotungsten compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used.

Examples of the organozirconium compound as the dopant organometallic compound include zirconium di-n-butoxide bis(2,4-pentanedionate) [Zr(C4H9O)2(C5H7O2)2] and zirconium acetylacetonate (standard nomenclature: zirconium-2,4-pentanedionate) [Zr(C5H7O2)4] as zirconium acetylacetone complexes; zirconium ethoxide [Zr(C2H5O)4], zirconium-n-propoxide [Zr(C3H7O)4], zirconium isopropoxide [Zr(C3H7O)4], zirconium n-butoxide [Zr(C4H9O)4], zirconium-tert-butoxide [Zr(C4H9O)4], zirconium-2-methyl-2-butoxide [Zr(C5H11O)4], and zirconium-2-methoxymethyl-2-propoxide [Zr(C5H11O2)4].

However, basically, any organozirconium compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used.

Among these, zirconium-n-propoxide and zirconium-n-butoxide are preferred because these compounds are easily available at relatively low cost.

Examples of the organotantalum compound as the dopant organometallic compound include tantalum(V) tetraethoxide-pentanedionate [Ta(C5H7O2)(OC2H5)4] as a tantalum acetylacetone complex; and tantalum methoxide [Ta(CH3O)5], tantalum ethoxide [Ta(C2H5O)5], tantalum isopropoxide [Ta(C3H7O)5], tantalum-n-butoxide [Ta(C4H9O)5], and tetraethoxyacetylacetonato tantalum [Ta(C2H5O)4(C5H7O2)] as tantalum alkoxides. However, basically, any organotantalum compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used.

Examples of the organoniobium compound as the dopant organometallic compound include niobium ethoxide [Nb(C2H5O)5] and niobium-n-butoxide [Nb(C4H9O)5] as niobium alkoxides. However, basically, any organoniobium compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used.

Examples of the organohafnium compound as the dopant organometallic compound include hafnium di-n-butoxide bis(2,4-pentanedionate) [Hf(C4H9O)2(C5H7O2)2] and hafnium acetylacetonate (standard nomenclature: hafnium-2,4-pentanedionate) [Hf(C5H7O2)4] as hafnium acetylacetone complexes; and hafnium ethoxide [Hf(C2H5O)4], hafnium-n-butoxide [Hf(C4H9O)4], hafnium-tert-butoxide [Hf(C4H9O)4], and hafnium(VI) isopropoxidemonoisopropylate [Hf(C3H7O)4(C3H7OH)] as hafnium alkoxides. However, basically, any organohafnium compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used.

Among these, hafnium-n-butoxide is preferred because the compound is easily available at relatively low cost.

Examples of the organovanadium compound as the dopant organometallic compound include vanadium(IV) oxide bis-2,4-pentanedionate [VO(C5H7O2)2] and vanadium acetylacetonate (standard nomenclature: vanadium(III)-2,4-pentanedionate) [V(C5H7O2)3] as vanadium acetylacetone complexes. However, basically, any organovanadium compound which dissolves in a solvent and is decomposed into an oxide without generating a harmful gas such as a chlorine gas or a nitrogen oxide gas in the processes for forming a transparent conductive film by applying, drying and baking a coating liquid for forming a transparent conductive film, may be used.

Here, the role of the various dopant organometallic compounds described above lies in the function of increasing the carrier concentration in a conductive oxide by being doped as metal oxides into indium oxide in a transparent conductive film which is finally obtained and is formed from a conductive oxide that contains indium oxide as a main component, and thereby enhancing the electrical conductivity of the transparent conductive film (for example, when a dopant organotin compound is used, a transparent conductive film formed from ITO is obtained).

The organoindium compound (indium acetylacetonate) and the dopant organometallic compound are primary compound raw materials for forming a transparent conductive film on a substrate, and the total content thereof in the coating liquid for forming a transparent conductive film is preferably set to the range of 5% to 15% by weight, and more preferably to 8% to 12% by weight.

If the content is less than 5% by weight, the film thickness of the transparent conductive film thus obtainable is decreased, and sufficient electrical conductivity may not be obtained. If the content is more than 15% by weight, indium acetylacetonate is prone to precipitate from the coating liquid for forming a transparent conductive film (particularly, during storage at low temperatures), and it is not practical.

Furthermore, the content ratio of the organoindium compound (indium acetylacetonate) and the dopant organometallic compound is preferably such that the molar ratio of organoindium compound/dopant organometallic compound is 99/1 to 87/13.

If the molar ratio is not in this range, and the content of the dopant organometallic compound is smaller or too larger, the carrier density of the transparent conductive film is decreased, and the electrical conductivity of the transparent conductive film may be drastically deteriorated, which is not preferable.

As for the organic viscosity-adjusting agent, a material which can improve wettability to a substrate and simultaneously adjust the viscosity of the coating liquid, and which is decomposed and burnt at a temperature lower than or equal to the temperature at the time of baking (baking temperature) and does not remain in the transparent conductive film, is preferred.

As such a material, a cellulose derivative is effective, and examples thereof include methylcellulose, ethylcellulose, and hydroxypropylcellulose (HPC). However, among these, hydroxypropylcellulose (HPC) is preferred.

The amount of incorporation of the organic viscosity-adjusting agent such as HPC in the coating liquid for forming a transparent conductive film is favorably 1/20 to 1/3 of the total content (by weight) of the organoindium compound and the dopant organometallic compound, and when the amount of incorporation is in this range, it is preferable because sufficient wettability to a substrate such as a glass substrate is obtained, and also, viscosity adjustment can be carried out to a large extent.

Here, as for most of cellulose derivatives such as HPC, the burning initiation temperature thereof is about 300° C., and therefore, when a substrate after application and drying is baked in air at a temperature of, for example, 400° C. or higher, cellulose derivatives such as HPC are decomposed and burnt. Therefore, particle growth of conductive oxide particles such as ITO thus produced is not inhibited, and a film having satisfactory electrical conductivity can be formed.

Meanwhile, if the amount of incorporation of the cellulose derivative such as HPC is larger than 1/3 as described above, the cellulose derivative in a gel state is prone to remain in the coating liquid, and electrical conductivity is impaired so as to form a porous transparent conductive film, which is not preferable.

For example, in the case of using HPC as the cellulose derivative, depending on the molecular weight (MW) thereof, there are several kinds of grades from low viscosity grade (MW=about 40,000) to high viscosity grade (MW=about 900,000) and thus the HPC product can be appropriately selected in the range of the amount of incorporation (1/20 to 1/3 of the total content of the organoindium compound and the dopant organometallic compound) in accordance with the use of the coating liquid for forming a transparent conductive film or the wet-coating method.

Regarding the high boiling point organic solvent (boiling point: 180° C. or higher) used in the heating and dissolution step for obtaining a highly concentrated solution, a mixed solvent of an alkylphenol and a dibasic acid ester, which satisfactorily dissolves indium acetylacetonate, dopant organometallic compounds such as tin acetylacetonate, and cellulose derivatives (particularly HPC), is preferred.

Examples of the alkylphenol include cresols, para-tertiary butylphenol (boiling point: 237° C.), octylphenol, and nonylphenol, but para-tertiary butylphenol is preferred.

Furthermore, examples of the dibasic acid ester include succinic acid esters, glutaric acid esters, and adipic acid esters, and for example, dimethyl malonate (boiling point: 181° C. to 183° C.), dimethyl succinate (boiling point: 196° C.), dimethyl glutarate (boiling point: 210° C. to 215° C.), and dimethyl adipate (boiling point: 215° C. to 225° C.) are preferred.

Regarding the medium boiling point organic solvent (boiling point: higher than or equal to 100° C. and lower than 180° C.) and the low boiling point organic solvent (boiling point: higher than or equal to 50° C. and lower than 100° C.) for diluting the highly concentrated solution in the dilution step, a ketone-based solvent is preferred, and examples thereof include acetone (boiling point: 56.1° C.), methyl ethyl ketone (MEK) (boiling point: 79.6° C.), methyl propyl ketone (boiling point: 102.3° C.), methyl isobutyl ketone (MIBK) (boiling point: 115.9° C.), acetylacetone (boiling point: 140.4° C.), and cyclohexanone (boiling point: 155.7° C.). However, the medium boiling point organic solvent is preferably cyclohexanone, and the low boiling point organic solvent is preferably methyl ethyl ketone.

If a small amount of propylene glycol monomethyl ether (PGM) (boiling point: 120° C.) is incorporated in addition to the cyclohexanone as the medium boiling point organic solvent, coatability of the coating liquid for forming a transparent conductive film can be enhanced, and therefore, it is more preferable.

Organic solvents other than the various organic solvents described above (high boiling point organic solvent, medium boiling point organic solvent, and low boiling point organic solvent) may also be incorporated in small amounts to the highly concentrated solution or the coating liquid for forming a transparent conductive film, for the purpose of adjusting the viscosity, coatability, drying rate and the like of the coating liquid for forming a transparent conductive film, as long as those organic solvents do not significantly impair the solubility, compatibility or the like of indium acetylacetonate, the dopant organometallic compound and the cellulose derivative in the heating and dissolution step or the dilution step.

Examples of such organic solvents include alcohol-based solvents such as methanol (MA), ethanol (EA), 1-propanol (NPA), isopropanol (IPA), butanol, pentanol, benzyl alcohol, and diacetone alcohol (DAA); ketone-based solvents such as isophorone; ester-based solvents such as ethyl acetate, butyl acetate, isobutyl acetate, amyl formate, isoamyl acetate, butyl propionate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, 3-oxypropionic acid methyl, 3-oxypropionic acid ethyl, 3-methoxy propionic acid methyl, 3-methoxypropionic acid ethyl, 3-ethoxypropionic acid methyl, 3-ethoxypropionic acid ethyl, 2-oxypropionic acid methyl, 2-oxypropionic acid ethyl, 2-oxypropionic acid propyl, 2-methoxypropionic acid methyl, 2-methoxypropionic acid ethyl, 2-methoxypropionic acid propyl, 2-ethoxypropionic acid methyl, 2-ethoxypropionic acid ethyl, 2-oxy-2-methylpropionic acid methyl, 2-oxy-2-methylpropionic acid ethyl, 2-methoxy-2-methylpropionic acid methyl, 2-ethoxy-2-methylpropionic acid ethyl, methyl pyruvic acid, ethyl pyruvic acid, propyl pyruvic acid, aceto methyl acetate, aceto ethyl acetate, 2-oxobutanoate methyl, and 2-oxobutanoate ethyl; glycol derivatives such as ethylene glycol monomethyl ether (MCS), ethylene glycol monoethyl ether (ECS), ethylene glycol isopropyl ether (IPC), ethylene glycol monobutyl ether (BCS), ethylene glycol monoethyl ether acetate, ethylene glycol monobutyl ether acetate, propylene glycol ethyl ether (PE), propylene glycol monomethyl ether acetate (PGM-AC), propylene glycol ethyl ether acetate (PE-AC), diethylene glycol monomethyl ether, diethylene glycol monoethyl ether, diethylene glycol monobutyl ether, diethylene glycol monomethyl ether acetate, diethylene glycol monoethyl ether acetate, diethylene glycol monobutyl ether acetate, diethylene glycol dimethyl ether, diethylene glycol diethyl ether, diethylene glycol dibutyl ether, dipropylene glycol monomethyl ether, dipropylene glycol monoethyl ether, and dipropylene glycol monobutyl ether; benzene derivatives such as toluene, xylene, mesitylene, and dodecylbenzene; formamide (FA), N-methyl formamide, dimethyl formamide (DMF), dimethyl acetoamide, dimethyl sulfoxide (DMSO), N-methyl-2-pyrrolidone (NMP), γ-butyrolactone, ethylene glycol, diethylene glycol, propylene glycol, dipropylene glycol, 1,3-butylene glycol, pentamethylene glycol, 1,3-octylene glycol, tetrahydrofuran (THF), chloroform, mineral spirits, terpineol, and a solution of mixture of some of these components.

In the heating and dissolution step of the present invention for heating and dissolving an organoindium compound (indium acetylacetonate), a dopant organometallic compound, and an organic viscosity-adjusting agent in a high boiling point organic solvent containing an alkylphenol and a dibasic acid ester while stirring, to allow the compounds to react, and thereby obtaining a highly concentrated solution, the indium acetylacetonate, the cellulose derivative and the high boiling point organic solvent react slowly along with the progress of heating, the color of the solution changes from light yellow to dark brown, and the viscosity of the liquid also increases gradually.

If the extent of this reaction is too low (that is, the heating temperature (T: ° C.) is low, and the heating time (L: hr) is short), the transparent conductive film thus obtainable is not easily densified and has relatively coarse voids (pores), and the haze of the film tends to be high (particularly, the blue haze tends to be high). On the other hand, if the extent of the reaction is too high (that is, the heating temperature (T: ° C.) is high, and the heating time (L: hr) is long), the coating liquid for forming a transparent conductive film thus obtainable has a high viscosity, has an increase in the viscosity with time, and has deteriorated stability, and the coating liquid eventually tends to gel (purination).

Here, the mechanism by which the blue haze or gelation (purination) occurs due to the differences in the reaction conditions for the heating and dissolution step is not necessarily clearly understood, but for example, factors such as follows may be taken into consideration.

It is speculated that as a result of heating of the heating and dissolution step, in the organoindium compound (indium acetylacetonate) as a main component in the coating liquid for forming a transparent conductive film, coordination of ester carbonyl groups (C(=O)O) of the dibasic acid ester (such as dimethyl glutarate) to the indium (In) site, or an interaction of hydroxyl groups (OH) of the alkylphenol (such as para-tertiary-butylphenol) or the cellulose derivative (such as hydroxypropyl cellulose) with the acetylacetonate ligand site occurs, and the differences in the structural changes at a microscopic level of the components of the coating liquid for forming a transparent conductive film caused thereby induce the blue haze or gelation (purination). In fact, hydrogen nucleus observation (1H-NMR) and carbon nucleus observation (13C-NMR) of nuclear magnetic resonance spectroscopy (NMR) was performed for the various constituent components of the coating liquid for forming a transparent conductive film, and in the cases of within the coating liquid and the components alone, chemical shifts were observed in the spectra thus obtained were observed, and the structural changes at a microscopic level were confirmed; however, it was not sufficient to elucidate the detailed structural changes.

Therefore, in order to appropriately adjust the extent of the reaction and to obtain a high quality coating liquid for forming a transparent conductive film, it is necessary to set the heating temperature and the heating time for the highly concentrated solution in the heating and dissolution step to particular ranges.

Specifically, the heating temperature (T: ° C.) is in the range of $130 \leq T \leq 180$, and the heating time (L: hr) is in the range of $-0.7T+104 < L < -1.1T+168$ ($130 \leq T < 140$), $-0.3T+48 < L < -0.6T+98$ ($140 \leq T < 150$), $-0.15T+25.5 < L < -0.4T+68$ ($150 \leq T < 160$), $-0.1T+17.5 < L < -0.2T+36$ ($160 \leq T < 170$), and $-0.025T+4.75 < L < -0.1T+19$ ($170 \leq T \leq 180$).

These ranges indicate the ranges sandwiched by the two upper and lower polygonal lines shown as dashed lines in the relation between the conditions for heating and dissolution/reaction (heating temperature (T: ° C.) and heating time (L: hr)) of the heating and dissolution step, and the quality status of the coating liquid for forming a transparent conductive film as shown in FIG. 1.

That is, on the longer time side of the heating time confined by the upper dashed line as a boundary in FIG. 1, "gelation (purination)" of the coating liquid for forming a transparent conductive film is likely to occur, and on the shorter time side of the heating time confined by the lower dashed line as a boundary in FIG. 1 (region in which the heating time is shorter compared to the region represented by the above Equation (1)), the "blue haze" of the transparent conductive film is likely to occur. From the viewpoint of preventing the "blue haze", it is preferable, on the occasion of carrying out the heating and dissolution step, to performing the processing under the temperature and time conditions that satisfy the above Equation (1).

Meanwhile, the heating temperature range is in the range of from 130° C. to 180° C., and the heating times on the lines of the two upper and lower polygonal lines (dashed lines) in FIG. 1 are not included.

If the heating temperature (T: ° C.) is lower than 130° C., the heating time (L: hr) appropriate for obtaining a high quality coating liquid for forming a transparent conductive film becomes very long (for example, about 24 hours or longer at 120° C.), and the production efficiency is markedly decreased. On the contrary, if the heating temperature is higher than 180° C., the range for appropriate heating time becomes excessively narrow, so that when the fluctuations in the in-liquid temperature distribution of the highly concentrated solution or the heating temperature control are considered, it is difficult to control the heating time to the appropriate range.

Thus, when the production efficiency such as the heating time, or the difficulty of production such as the heating temperature control is considered, the heating temperature (T: ° C.) is preferably 150° C. to 170° C., and particularly preferably 155° C. to 165° C.

Furthermore, even in a case in which plural different heating temperatures are used in combination in the heating and dissolution step (for example, a combination of a heating temperature of 160° C. and a heating temperature of 140° C.), in order to obtain a high quality coating liquid for forming a transparent conductive film, it is necessary to set the heating temperature and the heating time to particular ranges.

Figure 2:
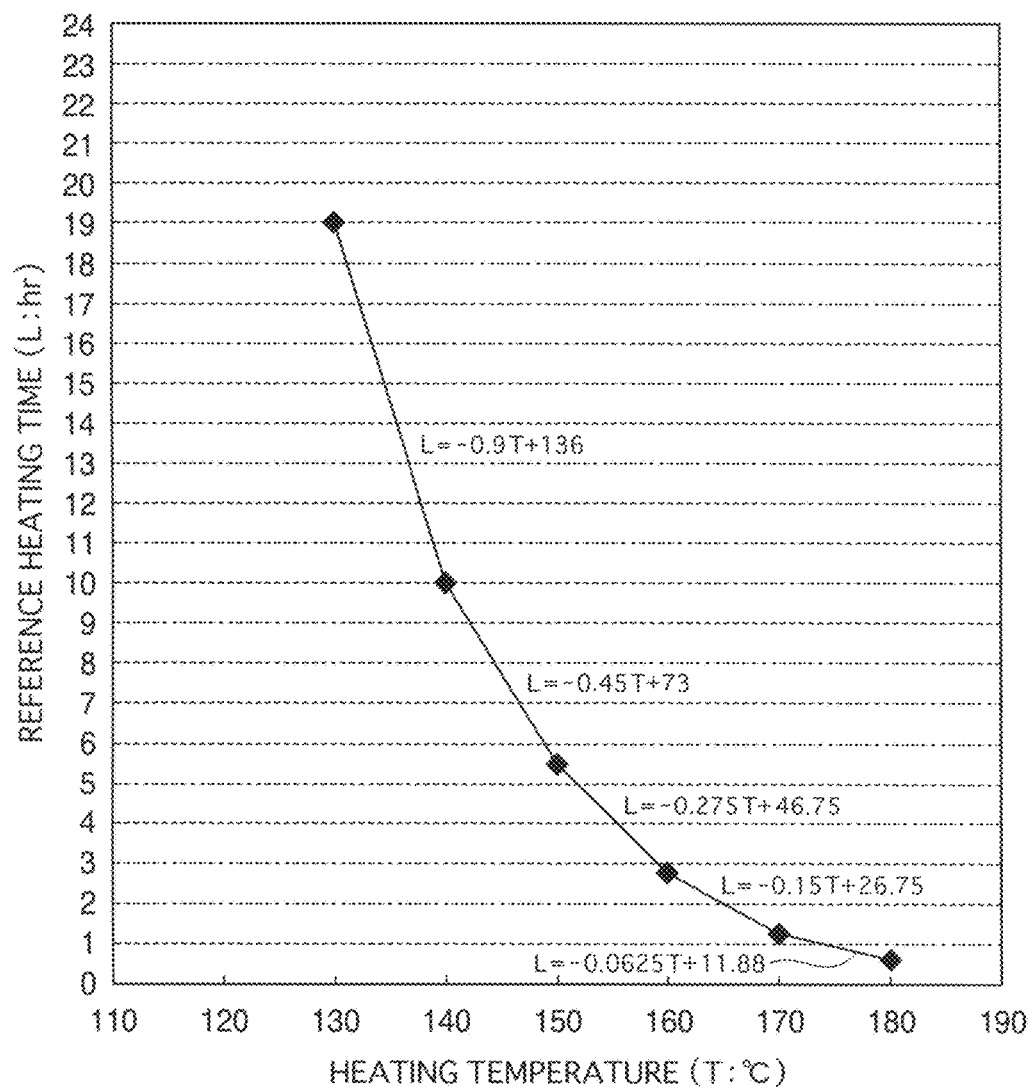
FIG. 2 is a diagram illustrating the relation between the heating temperature (T: ° C.) in the range in which a satisfactory coating liquid for forming a transparent conductive film can be obtained, and the heating time that serves as a reference [reference heating time] (L: hr), under the conditions for heating and dissolution/reaction (heating temperature (T: ° C.) and heating time (L: hr)) of the heating and dissolution step for the method for producing a coating liquid for forming a transparent conductive film according to the present invention.

In this case, the particular ranges can be set by the converted heating time represented by the following Equation (2), based on the center line (FIG. 2) of the solid lines connecting the midpoints of the two upper and lower polygonal lines indicated by dashed lines as shown in FIG. 1.

Here, the center line represents the relation between the heating temperature (T: ° C.) to the extent that a satisfactory coating liquid for forming a transparent conductive film is obtained, and the heating time that serves as a reference [reference heating time] (L: hr).

Specifically, the relation is represented by the following Equations using the heating temperature (T: ° C.) and the heating time (L: hr): $L=0.9T+136$ ($130 \leq T < 140$), $L=0.45T+73$ ($140 \leq T < 150$), $L=0.275T+46.75$ ($150 \leq T < 160$), $L=0.15T+26.75$ ($160 \leq T < 170$), and $L=0.0625T+11.88$ ($170 \leq T \leq 180$).

[Equation 2]

$$\text{Converted } T1 \text{ heating time (hr)} = \text{Actual } T1 \text{ heating time} + \text{actual } T2 \text{ heating time} \times (T1 \text{ reference heating time}/T2 \text{ reference heating time}) \quad (2)$$

wherein T1 and T2: plural different heating temperatures used in Heating and dissolution step For example, in the heating and dissolution step, when a case in which a heating temperature of 160° C. and a heating time of 1 hour, and a heating temperature of 140° C. and a heating time of 5 hours are combined is considered, a treatment at a heating temperature of 140° C. for a heating time of 5 hours corresponds to a heating temperature of 160° C. with a heating time of 1.38 hours. When this is added to the actual heating time (1 hour) at a heating treatment at 160° C., the converted 160° C. heating time is calculated to be 2.38 hours.

Since this converted 160° C. heating time of 2.38 hours falls in the particular range shown in FIG. 1, it can be expected to obtain a coating liquid for forming a transparent conductive film of good quality.

Furthermore, a coating liquid for forming a transparent conductive film produced by the heating and dissolution step has a property of almost maintaining the viscosity at the time of production even if left to stand at room temperature, and when the "viscosity after being left to stand for three months at room temperature" is viewed as a measure of the increase with time of the viscosity after production, the degree of viscosity change is from 0.5 times to 1.5 times (the viscosity change is ±50% or less) the initial viscosity (viscosity at the time of production), and the coating liquid for forming a transparent conductive film obtainable by the present invention has excellent stability and storability after production, so that a transparent conductive film can be formed easily by applying the coating liquid on a heat resistant substrate such as a glass substrate using a general-purpose wet-coating method such as a spin coating method or a dip coating method, and drying and baking the coating liquid.

Meanwhile, if the viscosity at the time of storage is more than 1.5 times the initial viscosity, fluidity significantly decreases, and it is difficult to form a smooth transparent conductive film using a general-purpose wet-coating method, which causes a decrease in film characteristics. Also, the coating liquid for forming a transparent conductive film tends to finally undergo gelation (purination), which is not preferable. On the contrary, if the viscosity is less than 0.5 times, that is, if a state in which the viscosity has decreased and fluidity has increased is achieved, it is difficult in this state to make the thickness of the film large in a smooth state by the wet-coating method. Thus, this causes deterioration of the film characteristics, similarly to the case of large viscosity changes.

The drying is carried out by maintaining the substrate on which the coating liquid has been applied, at a temperature of 80° C. to 180° C. for about 5 minutes to 20 minutes. The baking is carried out by heating the substrate with a drying-performed dried coating film in air at 300° C. or higher, and preferably at about 400° C. to 500° C., and maintaining the substrate for 15 minutes to 60 minutes.

If necessary, a treatment may be carried out, in which baking is performed in a neutral atmosphere or a reducing atmosphere subsequently to the baking in air, so as to weakly reduce the transparent conductive film and to thereby form oxygen vacancies (oxygen deficiencies) in the conductive oxide containing indium oxide as a main component, and the carrier concentration is increased to enhance electrical conductivity of the transparent conductive film.

Examples of the neutral atmosphere include any one or more of nitrogen gases and inert gases such as argon and helium.

On the other hand, the reducing atmosphere may be an atmosphere containing a hydrogen gas, or an atmosphere containing at least one or more of hydrogen and organic solvent vapors (for example, an organic gas such as methanol) in the neutral atmosphere; however, the atmosphere is not limited thereto as long as the atmosphere is capable of depriving conductive oxide fine particles that contain indium oxide as a main component and are densely packed, forming oxygen vacancies, and increasing the conductive carrier concentration. In this regard, if the atmosphere is an atmosphere with very strong reducing properties, reduction of indium oxide proceeds so excessively that the conductive carrier concentration is increased excessively, and thereby absorption occurs in the visible light region, causing blackening of the film. Thus, the transmittance of visible light may be decreased, which is not preferable.

In the reduction treatment process, an atmosphere obtained by incorporating 0.1% to 7% (volume %) of hydrogen gas into a nitrogen gas or an inert gas is preferred because there is no risk of explosion even if exposed to air.

Particularly, an atmosphere obtained by incorporating 1% to 3% (volume %) of hydrogen gas into a nitrogen gas or an inert gas is also an atmosphere preferable from the viewpoint that when the heating temperature of the reduction treatment process is high (for example, about 500° C. to 600° C.), blackening of the film does not easily occur.

According to the method for producing a coating liquid for forming a transparent conductive film of the present invention, since a high quality coating liquid for forming a transparent conductive film can be produced conveniently at low cost, a transparent conductive film formed by using the coating liquid for forming a transparent conductive film has both transparency and high electrical conductivity, and since the transparent conductive film is inexpensive, the film can be expected to be used in the display element transparent electrodes in various displays, and in transparent electrodes for touch panels, solar cells, field emission lamps and the like.

Hereinafter, the present invention will be described in detail by way of Examples, but the present invention is not intended to be limited to these Examples.

Example 1

Production of Coating Liquid for Forming Transparent Conductive Film 36.4 g of indium acetylacetonate (standard nomenclature: tris(acetylacetonato)indium [In($C_5H_7O_2$)$_3$] (molecular weight=412.15), 3.6 g of tin acetylacetonate (standard nomenclature: di-n-butyl bis(2,4-pentanedionato) tin [Sn($C_4H_9$)$_2$($C_5H_7O_2$)$_2$] (molecular weight=431.14), 42 g of p-tert-butylphenol, 14 g of dibasic acid esters (manufactured by DuPont Japan K.K.; a mixture of dimethyl succinate (boiling point: 196° C.), dimethyl glutarate (boiling point: 210° C. to 215° C.), and dimethyl adipate (boiling point: 215° C. to 225° C.)), and 4 g of hydroxypropylcellulose (HPC; MW=about 150,000 (medium viscosity grade)) were mixed, and the mixture was heated and dissolved, while being stirred, for 2 hours at 160° C. to react. Thus, a highly concentrated solution (total content of indium acetylacetonate and tin acetylacetonate: 40% by weight) was obtained.

To 25 g of this highly concentrated solution, 25 g of cyclohexanone (boiling point: 155.7° C.), 10 g of propylene glycol monomethyl ether (PGM) (boiling point: 120° C.), and 40 g of methyl ethyl ketone (MEK) (boiling point: 79.6° C.) as diluent solvents were added, and the mixture was thoroughly stirred until the mixture became uniform. Thus, a coating liquid for forming a transparent conductive film related to Example 1 (indium acetylacetonate:tin acetylacetonate=91.4:8.6 [molar ratio]), containing indium acetylacetonate and tin acetylacetonate in an amount of 10% by weight in total, and hydroxypropylcellulose in an amount of 1% by weight, was produced.

The viscosity of this coating liquid was measured using a cone-plate type viscometer (model: LVDV-II+Pro) manufactured by Brookfield Engineering Laboratories, Inc., and the viscosity was 3.1 mPa·s (25° C.). Meanwhile, the coating liquid for forming a transparent conductive film was left to stand for three months at room temperature, but there was no noticeable change in the viscosity.

Hereinafter, whether "there is no noticeable change" in the viscosity of the coating liquid in connection with Examples, is determined on the basis that the degree of the viscosity change in a case in which the coating liquid is left to stand for three months at room temperature, is from 0.5 times to 1.5 times (±50% or less) the initial viscosity.

[Production of Transparent Conductive Film]

This coating liquid for forming a transparent conductive film was applied by spin coating (1000 rpm×60 sec) over the entire surface of an alkali-free glass substrate (10 cm×10 cm×0.7 mm in thickness; haze value=0.26%, visible light transmittance=91.2%, blue haze value=0.26%, transmittance of light having a wavelength of 450 nm=91.0%), and then the coating liquid was dried using a hot air dryer for 5 minutes at 100° C. Furthermore, the temperature of the substrate was increased (temperature elevation rate: 10° C./min) to 500° C. over 50 minutes using a hot plate in an air atmosphere (supplied at 1 liter/min) having a dew point temperature of 15° C. to 20° C., and the coating liquid was baked at 500° C. for 15 minutes. Under the same conditions, the atmosphere was converted to an atmosphere of 1% hydrogen-99% nitrogen (supplied at 1 liter/min), and the coating liquid was baked for another 15 minutes at 500° C. Thus, a transparent conductive film (ITO film) containing indium oxide ($In_2O_3$) as a main component, with tin oxide ($SnO_2$) included as a dopant, was produced.

The general characteristics of the transparent conductive film thus produced, such as surface resistivity, a haze value, visible light transmittance, a blue haze value and film thickness, were measured, and the results are presented in Table 1.

Figure 3:
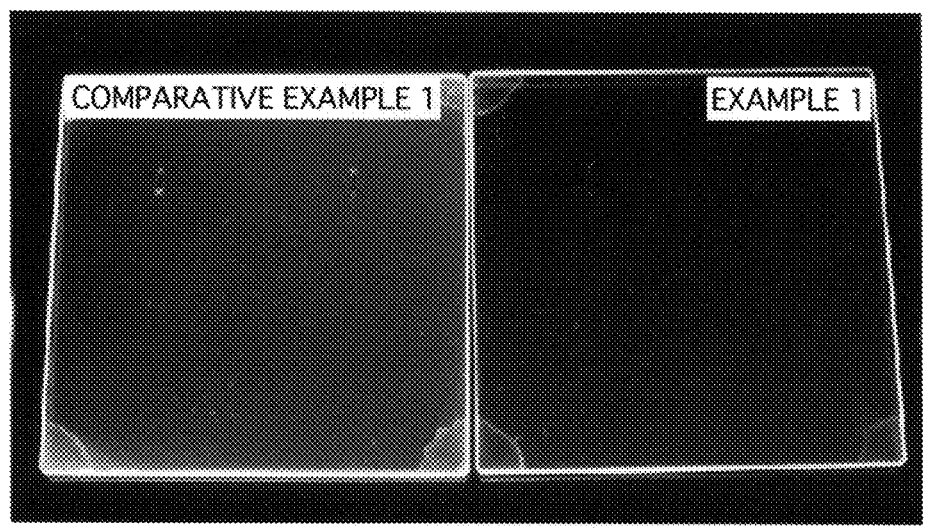
FIG. 3 is a diagram illustrating the external appearance (scattering state of visible light) of transparent conductive films when intense visible light (pseudo-sunlight) is irradiated to glass substrates on which transparent conductive films have been formed using the coating liquid for forming a transparent conductive film according to Example 1 and Comparative Example 1.

Furthermore, FIG. 3 shows the external appearance (scattering state of visible light) of the transparent conductive film when intense visible light (artificial sunlight) (light source: XC-100 manufactured by Seric, Ltd.) was irradiated to the glass substrate on which the transparent conductive film was formed. As is clearly seen from FIG. 3, scattering of visible light was not observed (particularly, blue haze was not observed), and it was found that the transparent conductive film had excellent transparency with a low haze.

The surface resistivity of the transparent conductive film was measured using a surface resistivity meter "LORESTA EP (MCP-T360) manufactured by Mitsubishi Chemical Corp.

The haze value and the visible light transmittance were measured using a haze meter "NDH5000" manufactured by Nippon Denshoku Industries Co., Ltd., according to JIS K7136 (haze value) and JIS K7361-1 (transmittance).

The blue haze value was calculated from the diffused light transmission profiles of a substrate and a substrate having a transparent conductive film formed thereon, which were measured using a spectrophotometer "U4000" manufactured by Hitachi, Ltd.

The film thickness was measured using an optical profiler ("NEWVIEW 6200" manufactured by Zygo Corp.).

Note that the visible light transmittance and the haze value were values for the transparent conductive film only, and were determined by the following Equation 3 and Equation 4, respectively.

Transmittance (%) of transparent conductive film=
(Transmittance measured for substrate together
with transparent conductive film formed
thereon)/(transmittance of substrate)×100       [Equation 3]

Haze value (%) of transparent conductive film=
(Haze value measured for substrate together
with transparent conductive film formed
thereon)−(haze value of substrate)              [Equation 4]

Furthermore, the blue haze value was also the value of the transparent conductive film only, and was determined by the following Equation 5. Here, the diffused light transmittance represents the proportion of light scattered without propagating rectilinearly, with respect to the light that is transmitted through the substrate.

Blue haze value (%) of transparent conductive film=
(Haze value[*1] at wavelength of 450 nm measured for substrate together with transparent conductive film formed thereon)−(haze value[*2] at wavelength of 450 nm of substrate)

[*1] Haze value at wavelength of 450 nm measured for substrate together with transparent conductive film formed thereon=(Transmittance of diffused light at wavelength of 450 nm measured for substrate together with transparent conductive film formed thereon)/(transmittance at wavelength of 450 nm measured for substrate together with transparent conductive film formed thereon)×100

[*2] Haze value at wavelength of 450 nm for substrate=(Transmittance of diffused light at wavelength of 450 nm for substrate)/(transmittance at wavelength of 450 nm for substrate)×100       [Equation 5]

Example 2

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 160° C. for 2.5 hours while stirring, so as to allow the components to react, and thus a coating liquid for forming a transparent conductive film related to Example 2 was produced. Meanwhile, the viscosity of this coating liquid was 3.2 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 3

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 160° C. for 3 hours while stirring, so as to allow the components to react, and thus a coating liquid for forming a transparent conductive film related to Example 3 was produced. Meanwhile, the viscosity of this coating liquid was 3.5 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Figure 4:
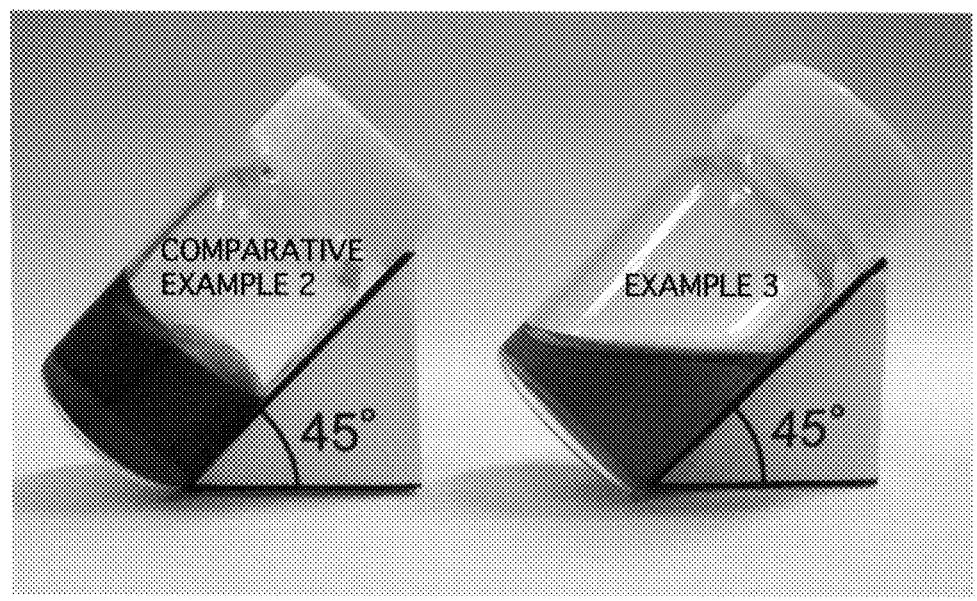
FIG. 4 is a diagram illustrating the external appearance (fluidity) at room temperature of the coating liquids for forming a transparent conductive film according to Example 3 and Comparative Example 2 that have been left to stand for three months at room temperature.

In addition, FIG. 4 shows the external appearance (fluidity) of the coating liquid when a glass container containing the coating liquid for forming a transparent conductive film (liquid state) of Example 3 that had been left to stand for three months at room temperature was tilted 45° at room temperature.

The surface of the coating liquid was kept horizontal even when tilted, and thus it was found that the coating liquid had satisfactory fluidity with a low viscosity.

Example 4

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 150° C. for 4 hours while stirring, so as to allow the components to react, and thus a coating liquid for forming a transparent conductive film related to Example 4 was produced. Meanwhile, the viscosity of this coating liquid was 3.1 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 5

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 150° C. for 5 hours while stirring, so as to allow the components to react, and thus a coating liquid for forming a transparent conductive film related to Example 5 was produced. Meanwhile, the viscosity of this coating liquid was 3.8 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 6

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 150° C. for 6 hours while stirring, so as to allow the components to react, and thus a coating liquid for forming a transparent conductive film related to Example 6 was produced. Meanwhile, the viscosity of this coating liquid was 4.3 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 7

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 170° C. for 1 hour while stirring, so as to allow the components to react, and thus a coating liquid for forming a transparent conductive film related to Example 7 was produced. Meanwhile, the viscosity of this coating liquid was 3.5 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 8

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 170° C. for 1.5 hours while stirring, so as to allow the components to react, and thus a coating liquid for forming a transparent conductive film related to Example 8 was produced. Meanwhile, the viscosity of this coating liquid was 3.7 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Figure 5:
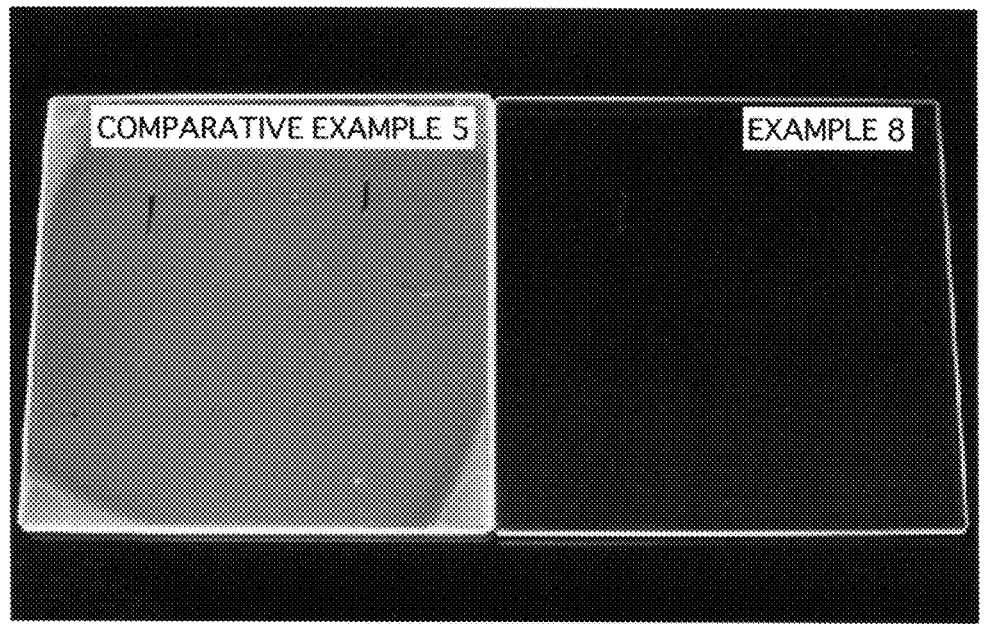
FIG. 5 is a diagram illustrating the external appearance (scattering state of visible light) of transparent conductive films when intense visible light (pseudo-sunlight) is irradiated to glass substrates on which transparent conductive films have been formed using the coating liquids for forming a transparent conductive film according to Example 8 and Comparative Example 5.

Furthermore, FIG. 5 shows the external appearance (scattering state of visible light) of the transparent conductive film when intense visible light (artificial sunlight) (light source: XC-100 manufactured by Seric, Ltd.) was irradiated to the glass substrate on which the transparent conductive film was formed.

Figure 6:
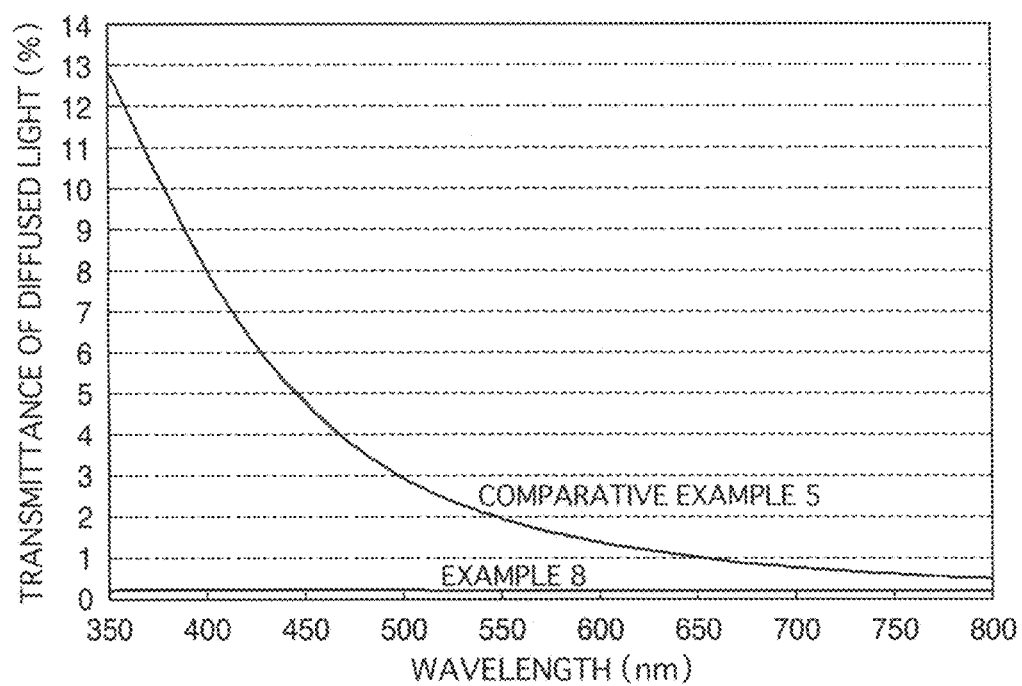
FIG. 6 is a diagram illustrating the diffused light transmittance profile in the visible light region (wavelength: 380 nm to 780 nm) of the glass substrates on which the transparent conductive films have been formed using the coating liquids for forming a transparent conductive film according to Example 8 and Comparative Example 5.

In addition, FIG. 6 shows the diffused light transmittance profile in the visible light region (wavelength: 380 nm to 780 nm) of the glass substrate on which the transparent conductive film was formed.

From FIG. 5 and FIG. 6, scattering of visible light was not observed (particularly, blue haze was not observed), and it was found that the transparent conductive film had excellent transparency with a low haze.

Figure 7:
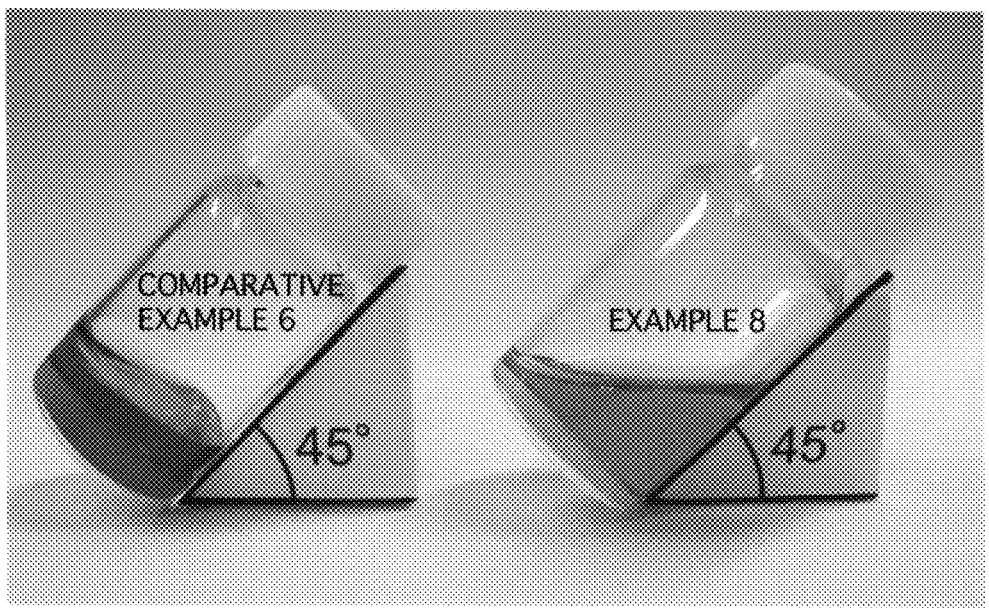
FIG. 7 is a diagram illustrating the external appearance (fluidity) at room temperature of the coating liquids for forming a transparent conductive film related to Example 8 and Comparative Example 6 that have been left to stand for three months at room temperature.

Also, FIG. 7 shows the external appearance (fluidity) of the coating liquid when a glass container containing the coating liquid for forming a transparent conductive film (liquid state) of Example 8 that had been left to stand for three months at room temperature, was tilted 45° at room temperature. The surface of the coating liquid was kept horizontal, and thus it was found that the coating liquid had satisfactory fluidity with a low viscosity.

Example 9

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 140° C. for 8 hours while stirring, so as to allow the components to react, and thus a coating liquid for forming a transparent conductive film related to Example 9 was produced. Meanwhile, the viscosity of this coating liquid was 4.6 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 10

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 140° C. for 12 hours while stirring, so as to allow the components to react, and thus a coating liquid for forming a transparent conductive film related to Example 10 was produced. Meanwhile, the viscosity of this coating liquid was 4.7 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Example 11

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 180° C. for 0.5 hours while stirring, so as to allow the components to react, and thus a coating liquid for forming a transparent conductive film related to Example 11 was produced. Meanwhile, the viscosity of this coating liquid was 3.3 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 12

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 130° C. for 16 hours while stirring, so as to allow the components to react, and thus a coating liquid for forming a transparent conductive film related to Example 12 was produced. Meanwhile, the viscosity of this coating liquid was 4.6 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 13

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 130° C. for 22 hours while stirring, so as to allow the components to react, and thus a coating liquid for forming a transparent conductive film related to Example 13 was produced. Meanwhile, the viscosity of this coating liquid was 4.8 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 14

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 150° C. for 2.5 hours while stirring, and at 140° C. for another 5 hours while continuously stirring, so as to allow the components to react, and thus a coating liquid for forming a transparent conductive film related to Example 14 was produced. Meanwhile, the viscosity of this coating liquid was 4.1 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, when intense visible light (artificial sunlight) was irradiated to the glass substrate on which the transparent conductive film was formed in the same manner as in Example 1, blue haze was not observed.

Example 15

Production of Coating Liquid for Forming Transparent Coating Film 87 g of dibasic acid esters (manufactured by DuPont Japan K.K.; a mixture of dimethyl succinate (boiling point: 196° C.), dimethyl glutarate (boiling point: 210° C. to 215° C.), and dimethyl adipate (boiling point: 215° C. to 225° C.), and 5 g of p-tert-butylphenol were mixed and dissolved by stirring for 10 minutes at room temperature, and then 1 g of hydroxypropylcellulose (HPC; MW=about 900,000 (high viscosity grade)) was mixed with the solution. The mixture was heated and dissolved, while being stirred, at 60° C. for one hour. Furthermore, 6.7 g of indium acetylacetonate (standard nomenclature: tris(acetylacetonato)indium) [In$(C_5H_7O_2)_3$] (molecular weight=412.15), and 0.3 g of tin acetylacetonate (standard nomenclature: di-n-butyl bis(2,4-pentanedionato) tin [Sn$(C_4H_9)_2(C_5H_7O_2)_2$] (molecular weight=431.14) were incorporated thereinto, and the mixture was heated and dissolved, while being stirred, at 160° C. for 2 hours to react. Thus, a highly concentrated solution (total content of indium acetylacetonate and tin acetylacetonate: 7% by weight) was obtained.

To 60 g of this highly concentrated solution, 40 g of acetylacetone (boiling point: 140.4° C.) as a diluent solvent was added, and the mixture was thoroughly stirred until the mixture became uniform. Thus, a coating liquid for forming a transparent conductive film related to Example 15 (indium acetylacetonate:tin acetylacetonate=95.9:4.1 [molar ratio]), containing indium acetylacetonate and tin acetylacetonate in an amount of 4.2% by weight in total, and hydroxypropylcellulose in an amount of 0.6% by weight, was produced. Meanwhile, the viscosity of this coating liquid was 3700 mPa·s (25° C.). Furthermore, even when the coating liquid for forming a transparent conductive film was left to stand for three months at room temperature, there was no noticeable change in the viscosity.

[Production of Transparent Conductive Film]

This coating liquid for forming a transparent conductive film was applied by spin coating (300 rpm×120 sec) over the entire surface of a soda lime glass substrate (10 cm×10 cm×3 mm in thickness; haze value=0.26%, visible light transmittance=91.7%, blue haze value=0.26%, transmittance of light having a wavelength of 450 nm=90.9%) that had been preheated to 80° C., and then the coating liquid was dried. Subsequently, the temperature of the substrate was increased (temperature elevation rate: 10° C./min) to 500° C. over 50 minutes using a hot plate in an air atmosphere (supplied at 1 liter/min) having a dew point temperature of 15° C. to 20° C., and the coating liquid was baked at 500° C. for 15 minutes. Under the same conditions, the atmosphere was converted to an atmosphere of 1% hydrogen-99% nitrogen (supplied at 1 liter/min), and the coating liquid was baked for another 15 minutes at 500° C. Thus, a transparent conductive film (ITO film) containing, indium oxide ($In_2O_3$) as a main component, with tin oxide ($SnO_2$) included as a dopant, was produced.

The general characteristics of the transparent conductive film thus produced, such as surface resistivity, a haze value, visible light transmittance, a blue haze value and film thickness, were measured, and the results are presented in Table 1.

Furthermore, similarly to Example 1, when intense visible light (artificial sunlight) was irradiated to the glass substrate on which the transparent conductive film was formed, blue haze was not observed.

Comparative Example 1

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 160° C. for 1.5 hours while stirring, so as to allow the components to react, and thus a coating liquid for forming a transparent conductive film related to Comparative Example 1 was produced. Meanwhile, the viscosity of this coating liquid was 2.9 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, FIG. 3 shows the external appearance state (scattering state of visible light) of the transparent conductive film when intense visible light (artificial sunlight) (light source: XC-100 manufactured by Seric, Ltd.) was irradiated to the glass substrate on which the transparent conductive film was formed.

Scattering of visible light (scattering of the shorter wavelength region (blue) that is particularly prone to be scattered: blue haze) was observed, and it was found that the transparent conductive film had inferior transparency with a high haze (high blue haze).

Comparative Example 2

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 160° C. for 4 hours while stirring, so as to allow the components to react, and thus a coating liquid for forming a transparent conductive film related to Comparative Example 2 was produced. Meanwhile, the viscosity of this coating liquid immediately after the production of the coating liquid had a slightly high value such as 5.0 mPa·s (25° C.); however, a transparent conductive film (ITO film)

was produced in the same manner as in Example 1, except that this coating liquid was used.

The general characteristics of the transparent conductive film thus produced, such as surface resistivity, a haze value, visible light transmittance, a blue haze value and film thickness, were measured, and the results are presented in Table 1.

Furthermore, the coating liquid for forming a transparent conductive film was left to stand for three months at room temperature, but the coating liquid eventually underwent gelation (purination) (viscosity: >10,000 mPa·s (25° C.)), and the coating liquid could not be used.

FIG. 4 shows the external appearance state (fluidity) of the coating liquid when a glass container containing the coating liquid for forming a transparent conductive film of Comparative Example 2 that had been left to stand for three months at room temperature (gelled (purinated)) was tilted 45° at room temperature.

The surface of the coating liquid remained tilted, and it was found that the coating liquid lost its fluidity as a result of gelation (purination) of the coating liquid.

Comparative Example 3

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 150° C. for 3 hours while stirring, so as to allow the components to react, and thus a coating liquid for forming a transparent conductive film related to Comparative Example 3 was produced. Meanwhile, the viscosity of this coating liquid was 3.0 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film described above was used. The general characteristics of the transparent conductive film thus produced, such as surface resistivity, a haze value, visible light transmittance, a blue haze value and film thickness, were measured, and the results are presented in Table 1.

Furthermore, similarly to Comparative Example 1, when intense visible light (artificial sunlight) was irradiated to the glass substrate on which the transparent conductive film was formed, a high blue haze was observed.

Comparative Example 4

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 150° C. for 8 hours while stirring, so as to allow the components to react, and thus a coating liquid for forming a transparent conductive film related to Comparative Example 4 was produced. Meanwhile, the viscosity of this coating liquid immediately after the production of the coating liquid had a slightly high value such as 5.3 mPa·s (25° C.); however, a transparent conductive film (ITO film) was produced in the same manner as in Example 1, except that this coating liquid was used.

The general characteristics of the transparent conductive film thus produced, such as surface resistivity, a haze value, visible light transmittance, a blue haze value and film thickness, were measured, and the results are presented in Table 1.

Furthermore, the coating liquid for forming a transparent conductive film was left to stand for three months at room temperature, but the coating liquid eventually underwent gelation (purination) (viscosity: >10,000 mPa·s (25° C.)), and the coating liquid could not be used.

Comparative Example 5

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 170° C. for 0.5 hours while stirring, so as to allow the components to react, and thus a coating liquid for forming a transparent conductive film related to Comparative Example 5 was produced. Meanwhile, the viscosity of this coating liquid was 2.8 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film was used.

The general characteristics of the transparent conductive film thus produced, such as surface resistivity, a haze value, visible light transmittance, a blue haze value and film thickness, were measured, and the results are presented in Table 1.

FIG. 5 shows the external appearance state (scattering state of visible light) of the transparent conductive film when intense visible light (artificial sunlight) (light source: XC-100 manufactured by Seric, Ltd.) was irradiated to the glass substrate on which the transparent conductive film was formed.

In addition, FIG. 6 shows the diffused light transmittance profile in the visible light region (wavelength: 380 nm to 780 nm) of the glass substrate on which the transparent conductive film was formed.

From FIG. 5 and FIG. 6, scattering of visible light (scattering of the shorter wavelength region (blue) that is particularly prone to be scattered: blue haze) was observed, and it was found that the transparent conductive film had inferior transparency with a high haze (high blue haze).

Comparative Example 6

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 170° C. for 2 hours while stirring, so as to allow the components to react, and thus a coating liquid for forming a transparent conductive film related to Comparative Example 6 was produced. The viscosity of this coating liquid immediately after the production of the coating liquid had a conventional value (within a normal range) such as 4.2 mPa·s (25° C.), and a transparent conductive film (ITO film) was produced in the same manner as in Example 1, except that this coating liquid was used.

The general characteristics of the transparent conductive film thus produced, such as surface resistivity, a haze value, visible light transmittance, a blue haze value and film thickness, were measured, and the results are presented in Table 1.

Furthermore, the coating liquid for forming a transparent conductive film was left to stand for three months at room temperature, but the coating liquid eventually underwent gelation (purination) (viscosity: >10,000 mPa·s (25° C.)), and the coating liquid could not be used.

FIG. 7 shows the external appearance state (fluidity) of the coating liquid when a glass container containing the coating liquid for forming a transparent conductive film of Comparative Example 6 that had been left to stand for three months at room temperature (gelled (purinated)) was tilted 45° at room temperature.

The surface of the coating liquid remained tilted, and it was found that the coating liquid lost its fluidity as a result of gelation (purination) of the coating liquid.

Comparative Example 7

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 140° C. for 6 hours while stirring, so as to allow the components to react, and thus a coating liquid for forming a transparent conductive film related to Comparative Example 7 was produced. Meanwhile, the viscosity of this coating liquid was 3.1 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film was used. The general characteristics of the transparent conductive film thus produced, such as surface resistivity, a haze value, visible light transmittance, a blue haze value and film thickness, were measured, and the results are presented in Table 1.

Furthermore, similarly to Comparative Example 1, when intense visible light (artificial sunlight) was irradiated on the glass substrate on which the transparent conductive film was formed, a high blue haze was observed.

Comparative Example 8

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 140° C. for 14 hours while stirring, so as to allow the components to react, and thus a coating liquid for forming a transparent conductive film related to Comparative Example 8 was produced. Meanwhile, the viscosity of this coating liquid immediately after the production of the coating liquid had a conventional value (within a normal range) such as 4.8 mPa·s (25° C.), and a transparent conductive film (ITO film) was produced in the same manner as in Example 1, except this coating liquid was used. The general characteristics of the transparent conductive film thus produced, such as surface resistivity, a haze value, visible light transmittance, a blue haze value and film thickness, were measured, and the results are presented in Table 1.

Furthermore, the coating liquid for forming a transparent conductive film was left to stand for three months at room temperature, but the coating liquid eventually underwent gelation (purination) (viscosity: >10,000 mPa·s (25° C.)), and the coating liquid could not be used.

Comparative Example 9

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 180° C. for 0.25 hours (15 minutes) while stirring, so as to allow the components to react, and thus a coating liquid for forming a transparent conductive film related to Comparative Example 9 was produced. Meanwhile, the viscosity of this coating liquid was 2.8 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film was used. The general characteristics of the transparent conductive film thus produced, such as surface resistivity, a haze value, visible light transmittance, a blue haze value and film thickness, were measured, and the results are presented in Table 1.

Furthermore, similarly to Comparative Example 1, when intense visible light (artificial sunlight) was irradiated on the glass substrate on which the transparent conductive film was formed, a high blue haze was observed.

Comparative Example 10

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 180° C. for 1 hour while stirring, so as to allow the components to react, and thus a coating liquid for forming a transparent conductive film related to Comparative Example 10 was produced. Meanwhile, the viscosity of this coating liquid immediately after the production of the coating liquid had a conventional value (within a normal range) such as 4.1 mPa·s (25° C.), and a transparent conductive film (ITO film) was produced in the same manner as in Example 1, except that this coating liquid was used. The general characteristics of the transparent conductive film thus produced, such as surface resistivity, a haze value, visible light transmittance, a blue haze value and film thickness, were measured, and the results are presented in Table 1.

Furthermore, the coating liquid for forming a transparent conductive film was left to stand for three months at room temperature, but the coating liquid eventually underwent gelation (purination) (viscosity: >10,000 mPa·s (25° C.)), and the coating liquid could not be used.

Comparative Example 11

Production was carried out in the same manner as in Example 1, except that a highly concentrated solution (total content of indium acetylacetonate and tin acetylacetonate: 40% by weight) was obtained by heating and dissolving the components at 130° C. for 13 hours while stirring, so as to allow the components to react, and thus a coating liquid for forming a transparent conductive film related to Comparative Example 11 was produced. Meanwhile, the viscosity of this coating liquid was 3.3 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 1, except that the coating liquid for forming a transparent conductive film was used. The general characteristics of the transparent conductive film thus produced, such as surface resistivity, a haze value, visible light transmittance, a blue haze value and film thickness, were measured, and the results are presented in Table 1.

Furthermore, similarly to Comparative Example 1, when intense visible light (artificial sunlight) was irradiated on the glass substrate on which the transparent conductive film was formed, a high blue haze was observed.

Comparative Example 12

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 130° C. for 25 hours while stirring, so as to allow the components to react, and thus a coating liquid for forming a transparent conductive film related to Comparative Example 12 was produced. Meanwhile, the viscosity of this coating liquid immediately after the production of the coating liquid had a slightly high value such as 5.0 mPa·s (25° C.); however), a transparent conductive film (ITO film) was produced in the same manner as in Example 1, except that this coating liquid was used. The general characteristics of the transparent conductive film thus produced, such as surface resistivity, a haze value, visible light transmittance, a blue haze value and film thickness, were measured, and the results are presented in Table 1.

Furthermore, the coating liquid for forming a transparent conductive film was left to stand for three months at room temperature, but the coating liquid eventually underwent gelation (purination) (viscosity: >10,000 mPa·s (25° C.)), and the coating liquid could not be used.

Comparative Example 13

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 190° C. for 0.15 hours while stirring, so as to allow the components to react, and thus a coating liquid for forming a transparent conductive film related to Comparative Example 13 was produced.

Furthermore, production of the coating liquid for forming a transparent conductive film was carried out several times by the procedure described above, but a coating liquid for forming a transparent conductive film with a satisfactory product quality, which did not exhibit gelation (purination) of the coating liquid or deterioration of the haze (particularly, deterioration of blue haze) of the transparent conductive film, could not be obtained stably.

This is speculated to be because since the appropriate range of the heating time is very narrow at a heating temperature of 190° C., optimization of the conditions for heating and dissolution/reaction is made difficult due to the in-liquid temperature distribution of the highly concentrated solution, fluctuations in the control of heating temperature, fluctuations in the temperature elevation history up to a heating temperature of 190° C., and the like.

As described above, since it was difficult to stably obtain a coating liquid for forming a transparent conductive film having a satisfactory product quality, production of a transparent conductive film such as in Example 1 was not carried out.

Comparative Example 14

Production of Transparent Conductive Film

Production was carried out in the same manner as in Example 1, except that a highly concentrated solution (total content of indium acetylacetonate and tin acetylacetonate: 40% by weight) was obtained by heating and dissolving the components at 160° C. for 2 hours while stirring, and at 140° C. for another 10 hours while continuously stirring, so as to allow the components to react, and thus a coating liquid for forming a transparent conductive film related to Comparative Example 14 was produced.

The viscosity of this coating liquid immediately after the production of the coating liquid had a conventional value (within a normal range) such as 5.4 mPa·s (25° C.), and a transparent conductive film (ITO film) was produced in the same manner as in Example 1, except this coating liquid was used.

The general characteristics of the transparent conductive film thus produced, such as surface resistivity, a haze value, visible light transmittance, a blue haze value and film thickness, were measured, and the results are presented in Table 1.

Furthermore, the coating liquid for forming a transparent conductive film was left to stand for three months at room temperature, but the coating liquid eventually underwent gelation (purination) (viscosity: >10,000 mPa·s (25° C.)), and the coating liquid could not be used.

Comparative Example 15

Production of Transparent Conductive Film

Production was carried out in the same manner as in Example 15, except that a highly concentrated solution (total content of indium acetylacetonate and tin acetylacetonate: 7% by weight) was obtained by heating and dissolving the components at 160° C. for 1 hour while stirring, so as to allow the components to react, and thus a coating liquid for forming a transparent conductive film related to Comparative Example 15 was produced. Meanwhile, the viscosity of this coating liquid was 3500 mPa·s (25° C.). Furthermore, even when the coating liquid for forming a transparent conductive film was left to stand for three months at room temperature, there was no noticeable change in the viscosity.

Next, a transparent conductive film (ITO film) was produced in the same manner as in Example 15, except that the coating liquid for forming a transparent conductive film was used. The general characteristics of the transparent conductive film thus produced, such as surface resistivity, a haze value, visible light transmittance, a blue haze value and film thickness, were measured, and the results are presented in Table 1.

Furthermore, similarly to Comparative Example 1, when intense visible light (artificial sunlight) was irradiated on the glass substrate on which the transparent conductive film was formed, a high blue haze was observed.

TABLE 1

| | Heating temperature [° C.] | Heating time [hr] | Surface resistivity [Ω/sq] | Visible light transmittance [%] *1 | Haze value [%] | Blue haze value [%] | Film thickness [nm] | Viscosity immediately after ink production [mPa·s] | Gelation (purination) of coating liquid for forming transparent conductive film |
|---|---|---|---|---|---|---|---|---|---|
| Example 1 | 160 | 2 | 315 | 100.2 | 0.03 | 0.02 | 113 | 3.1 | None |
| Example 2 | 160 | 2.5 | 285 | 100.2 | 0.04 | 0.03 | 127 | 3.2 | None |
| Example 3 | 160 | 3 | 255 | 100.0 | 0.02 | 0.02 | 132 | 3.5 | None |
| Example 4 | 150 | 4 | 340 | 100.6 | 0.02 | 0.02 | 116 | 3.1 | None |
| Example 5 | 150 | 5 | 265 | 100.2 | 0.02 | 0.01 | 126 | 3.8 | None |
| Example 6 | 150 | 6 | 235 | 100.0 | 0.03 | 0.01 | 134 | 4.3 | None |
| Example 7 | 170 | 1 | 235 | 100.0 | 0.06 | 0.04 | 131 | 3.5 | None |
| Example 8 | 170 | 1.5 | 250 | 100.3 | 0.02 | 0.01 | 130 | 3.7 | None |
| Example 9 | 140 | 8 | 250 | 100.2 | 0.01 | 0.01 | 119 | 4.6 | None |
| Example 10 | 140 | 12 | 245 | 100.1 | 0.01 | 0.01 | 135 | 4.7 | None |
| Example 11 | 180 | 0.5 | 240 | 100.0 | 0.05 | 0.03 | 120 | 3.3 | None |
| Example 12 | 130 | 16 | 235 | 100.3 | 0.04 | 0.03 | 117 | 4.6 | None |
| Example 13 | 130 | 22 | 260 | 100.2 | 0.01 | 0.01 | 137 | 4.8 | None |
| Example 14 | 150 140 150 (equivalently converted) | 2.5 5 5.25 (equivalently converted) | 255 | 100.1 | 0.03 | 0.02 | 129 | 4.1 | None |
| Example 15 | 160 | 2 | 350 | 100.2 | 0.04 | 0.04 | 120 | 3700 | None |
| Comparative Example 1 | 160 | 1.5 | 490 | 100.2 | 0.26 | 0.63 | 107 | 2.9 | None |
| Comparative Example 2 | 160 | 4 | 230 | 100.0 | 0.02 | 0.02 | 149 | 5.0 | Occurred |
| Comparative Example 3 | 150 | 3 | 500 | 100.2 | 0.24 | 0.61 | 110 | 3.0 | None |
| Comparative Example 4 | 150 | 8 | 225 | 100.1 | 0.01 | 0.01 | 145 | 5.3 | Occurred |
| Comparative Example 5 | 170 | 0.5 | 375 | 98.2 | 3.16 | 5.00 | 105 | 2.8 | None |
| Comparative Example 6 | 170 | 2 | 205 | 100.0 | 0.06 | 0.04 | 148 | 4.2 | Occurred |
| Comparative Example 7 | 140 | 6 | 350 | 99.3 | 0.60 | 1.04 | 114 | 3.1 | None |
| Comparative Example 8 | 140 | 14 | 235 | 100.0 | 0.01 | 0.01 | 143 | 4.8 | Occurred |
| Comparative Example 9 | 180 | 0.25 | 440 | 98.5 | 2.83 | 4.45 | 108 | 2.8 | None |
| Comparative Example 10 | 180 | 1 | 215 | 99.9 | 0.03 | 0.02 | 150 | 4.1 | Occurred |
| Comparative Example 11 | 130 | 13 | 420 | 99.7 | 0.85 | 1.45 | 111 | 3.3 | None |
| Comparative Example 12 | 130 | 25 | 245 | 100.0 | 0.01 | 0.01 | 147 | 5.0 | Occurred |
| Comparative Example 13 | 190 | 0.15 | — | — | — | — | — | — | — |
| Comparative Example 14 | 160 140 160 (equivalently converted) | 2 10 4.75 (equivalently converted) | 250 | 100.0 | 0.04 | 0.03 | 152 | 5.4 | Occurred |
| Comparative Example 15 | 160 | 1 | 660 | 98.9 | 2.63 | 4.20 | 115 | 3500 | None |

*1 When a transparent conductive film is formed on a surface of a substrate, and the reflectance of the surface on which the transparent conductive film is formed is lower than the reflectance of the substrate surface (if a low reflection function is imparted by the formation of a transparent conductive film), the apparent transmittance of the transparent conductive film may exceed 100%.

When respective Examples and Comparative Examples are compared (Examples 1 to 3, and Comparative Examples 1 and 2), all of them are coating liquids for forming a transparent conductive film obtained through highly concentrated solutions that have been heated and dissolved at 160° C. to react. However, it is understood that the coating liquids for forming a transparent conductive film of Examples 1 to 3 that had been heated and dissolved to react at this heating and dissolution temperature for a heating time in a predetermined range, exhibit small changes with time in the viscosity and satisfactory stability, and the transparent conductive films thus obtainable exhibit low haze (particularly, blue haze is not observed) with low resistance.

On the other hand, when the coating liquids for forming a transparent conductive film of Comparative Example 1 and Comparative Example 2 that had been heated and dissolved to react at this heating and dissolution temperature for a heating time that was not in a predetermined range (the heating time was shorter or longer) were used, it was confirmed that in Comparative Example 1, only a transparent conductive film exhibiting a high haze (particularly, high blue haze) and inferior transparency could be obtained; and in Comparative Example 2, the change with time in the viscosity of the coating liquid for forming a transparent conductive film was large so that the coating liquid exhibited poor stability and eventually underwent gelation (purination).

Here, from the results of an evaluation of the degree of scattering of visible light, in which intense visible light (pseudo-sunlight) was irradiated to a glass substrate on which a transparent conductive film was formed, as shown in FIG. 3, it is clearly confirmed that the transparent conductive film formed using the coating liquid for forming a transparent conductive film of Example 1 (heating temperature (T): 160° C., heating time (L): 2 hr) exhibit excellent transparency without scattering of visible light, while the transparent conductive film formed using the coating liquid for forming a transparent conductive film of Comparative Example 1 (heating temperature (T): 160° C., heating time (L): 1.5 hr) exhibit inferior transparency with significant scattering of the short wavelength region (blue) of visible light (that is, high blue haze).

Furthermore, from the results of an evaluation of the fluidity of a coating liquid, in which a glass container containing a coating liquid for forming a transparent conductive film that had been left to stand for three months at room temperature, was tilted 45° at room temperature, as shown in FIG. 4, it is confirmed that the coating liquid for forming a transparent conductive film of Example 3 (heating temperature (T): 160° C., heating time (L): 3 hr) has satisfactory fluidity with a low viscosity, while the coating liquid for forming a transparent conductive film of Comparative Example 2 (heating temperature (T): 160° C., heating time (L): 4 hr) has undergone gelation (purination) and lost fluidity.

When respective Examples and Comparative Examples are compared (Examples 4 to 6, and Comparative Examples 3 and 4), all of them are coating liquids for forming a transparent conductive film obtained through highly concentrated solutions that have been heated and dissolved at 150° C. to react. However, it is understood that the coating liquids for forming a transparent conductive film of Examples 4 to 6 that had been heated and dissolved to react at this heating and dissolution temperature for a heating time in a predetermined range, exhibit small changes with time in the viscosity and satisfactory stability, and the transparent conductive films thus obtainable exhibit low haze (particularly, blue haze is not observed) with low resistance.

On the other hand, when the coating liquids for forming a transparent conductive film of Comparative Example 3 and Comparative Example 4 that had been heated and dissolved to react at this heating and dissolution temperature for a heating time that was not in a predetermined range (the heating time was shorter or longer) were used, it was confirmed that in Comparative Example 3, only a transparent conductive film exhibiting a high haze (particularly, high blue haze) and inferior transparency could be obtained; and in Comparative Example 4, the change with time in the viscosity of the coating liquid for forming a transparent conductive film was large so that the coating liquid exhibited poor stability and eventually underwent gelation (purination).

When respective Examples and Comparative Examples are compared (Examples 7 and 8, and Comparative Examples 5 and 6), all of them are coating liquids for forming a transparent conductive film obtained through highly concentrated solutions that have been heated and dissolved at 170° C. to react. However, it is understood that the coating liquids for forming a transparent conductive film of Examples 7 and 8 that had been heated and dissolved to react at this heating and dissolution temperature for a heating time in a predetermined range, exhibit small changes with time in the viscosity and satisfactory stability, and the transparent conductive films thus obtainable exhibit low haze (particularly, blue haze is not observed) with low resistance.

On the other hand, when the coating liquids for forming a transparent conductive film of Comparative Example 5 and Comparative Example 6 that had been heated and dissolved to react at this heating and dissolution temperature for a heating time that was not in a predetermined range (the heating time was shorter or longer) were used, it was confirmed that in Comparative Example 5, only a transparent conductive film exhibiting a high haze (particularly, high blue haze) and inferior transparency could be obtained; and in Comparative Example 6, the change with time in the viscosity of the coating liquid for forming a transparent conductive film was large so that the coating liquid exhibited poor stability and eventually underwent gelation (purination).

Here, from the results of an evaluation of the degree of scattering of visible light, in which intense visible light (pseudo-sunlight) was irradiated to a glass substrate on which a transparent conductive film was formed, as shown in FIG. 5, it is clearly confirmed that the transparent conductive film formed using the coating liquid for forming a transparent conductive film of Example 8 (heating temperature (T): 170° C., heating time (L): 1.5 hr) exhibit excellent transparency without scattering of visible light, while the transparent conductive film formed using the coating liquid for forming a transparent conductive film of Comparative Example 5 (heating temperature (T): 170° C., heating time (L): 0.5 hr) exhibit inferior transparency with significant scattering of the short wavelength region (blue) of visible light (that is, high blue haze).

Here, from the results of the measurement of diffused light transmittance profile in the visible light region (wavelength: 380 nm to 780 nm) of a glass substrate on which a transparent conductive film was formed, as shown in FIG. 6, it is clearly confirmed that the transparent conductive film formed using the coating liquid for forming a transparent conductive film of Example 8 (heating temperature (T): 170° C., heating time (L): 1.5 hr) exhibit excellent transparency without scattering of visible light, while the transparent conductive film formed using the coating liquid for forming a transparent conductive film of Comparative Example 5 (heating temperature (T): 170° C., heating time (L): 0.5 hr) exhibit inferior transparency with significant scattering of the short wavelength region (blue) of visible light (that is, high blue haze).

Furthermore, from the results of an evaluation of the fluidity of a coating liquid, in which a glass container containing a coating liquid for forming a transparent conductive film that had been left to stand for three months at room temperature, was tilted 45° at room temperature, as shown in FIG. 7, it is confirmed that the coating liquid for forming a transparent conductive film of Example 8 (heating temperature (T): 170° C., heating time (L): 1.5 hr) has satisfactory fluidity with a low viscosity, while the coating liquid for forming a transparent conductive film of Comparative Example 6 (heating temperature (T): 170° C., heating time (L): 2 hr) has undergone gelation (purination) and lost fluidity.

When respective Examples and Comparative Examples are compared (Examples 9 and 10, and Comparative Examples 7 and 8), all of them are coating liquids for forming a transparent conductive film obtained through highly concentrated solutions that have been heated and dissolved at 140° C. to react. However, it is understood that the coating liquids for forming a transparent conductive film of Examples 9 and 10 that had been heated and dissolved to react at this heating and dissolution temperature for a heating time in a predetermined range, exhibit small changes with time in the viscosity and satisfactory stability, and the transparent conductive films thus obtainable exhibit low haze (particularly, blue haze is not observed) with low resistance.

On the other hand, when the coating liquids for forming a transparent conductive film of Comparative Example 7 and Comparative Example 8 that had been heated and dissolved to react at this heating and dissolution temperature for a heating time that was not in a predetermined range (the heating time was shorter or longer) were used, it was confirmed that in Comparative Example 7, only a transparent conductive film exhibiting a high haze (particularly, high blue haze) and inferior transparency could be obtained; and in Comparative Example 8, the change with time in the viscosity of the coating liquid for forming a transparent conductive film was large so that the coating liquid exhibited poor stability and eventually underwent gelation (purination).

When respective Examples and Comparative Examples are compared (Example 11, and Comparative Examples 9 and 10), all of them are coating liquids for forming a transparent conductive film obtained through highly concentrated solutions that have been heated and dissolved at 180° C. to react. However, it is understood that the coating liquid for forming a transparent conductive film of Example 11 that had been heated and dissolved to react at this heating and dissolution temperature for a heating time in a predetermined range, exhibits a small change with time in the viscosity and satisfactory stability, and the transparent conductive film thus obtainable exhibits low haze (particularly, blue haze is not observed) with low resistance.

On the other hand, when the coating liquids for forming a transparent conductive film of Comparative Example 9 and Comparative Example 10 that had been heated and dissolved to react at this heating and dissolution temperature for a heating time that was not in a predetermined range (the heating time was shorter or longer) were used, it was confirmed that in Comparative Example 9, only a transparent conductive film exhibiting a high haze (particularly, high blue haze) and inferior transparency could be obtained; and in Comparative Example 10, the change with time in the viscosity of the coating liquid for forming a transparent conductive film was large so that the coating liquid exhibited poor stability and eventually underwent gelation (purination).

When respective Examples and Comparative Examples are compared (Examples 12 and 13, and Comparative Examples 11 and 12), all of them are coating liquids for forming a transparent conductive film obtained through highly concentrated solutions that have been heated and dissolved at 130° C. to react. However, it is understood that the coating liquids for forming a transparent conductive film of Examples 12 and 13 that had been heated and dissolved to react at this heating and dissolution temperature for a heating time in a predetermined range, exhibit small changes with time in the viscosity and satisfactory stability, and the transparent conductive films thus obtainable exhibit low haze (particularly, blue haze is not observed) with low resistance. On the other hand, when the coating liquids for forming a transparent conductive film of Comparative Example 11 and Comparative Example 12 that had been heated and dissolved to react at this heating and dissolution temperature for a heating time that was not in a predetermined range (the heating time was shorter or longer) were used, it was confirmed that in Comparative Example 11, only a transparent conductive film exhibiting a high haze (particularly, high blue haze) and inferior transparency could be obtained; and in Comparative Example 12, the change with time in the viscosity of the coating liquid for forming a transparent conductive film was large so that the coating liquid exhibited poor stability and eventually underwent gelation (purination).

When respective Examples and Comparative Examples are compared (Example 14 and Comparative Example 14), all of them are coating liquids for forming a transparent conductive film obtained through highly concentrated solutions that have been heated and dissolved at plural different heating and dissolution temperatures to react. However, when the relation between the heating and dissolution temperature and time is determined using the "converted heating time" represented by Equation (2), Example 14 that is in the particular range shown in FIG. 1 exhibits a small change with time in the viscosity and satisfactory stability, and the transparent conductive film thus obtainable exhibits low haze (particularly, blue haze is not observed) with low resistance.

On the other hand, it was confirmed that in Comparative Example 14 that was not in the particular range, the change with time in the viscosity of the coating liquid for forming a transparent conductive film was large so that the coating liquid exhibited poor stability and eventually underwent gelation (purination).

When respective Examples and Comparative Examples are compared (Example 15 and Comparative Example 15 [a coating liquid for forming a transparent conductive film obtainable by the method described in Example 7 of Japanese Unexamined Patent Application Publication No. 6-203658), all of them are coating liquids for forming a transparent conductive film obtained through highly concentrated solutions that have been heated and dissolved at 160° C. to react. However, it is understood that Example 15 that had been heated and dissolved to react at this heating and dissolution temperature for a heating time in a predetermined range, exhibits a small change with time in the viscosity and satisfactory stability, and the transparent conductive film thus obtainable exhibits low haze (particularly, blue haze is not observed) with low resistance.

On the other hand, when the coating liquid for forming a transparent conductive film of Comparative Example 15 that had been heated and dissolved to react at this heating and dissolution temperature for a heating time that was not in a predetermined range (the heating time was shorter) were used, it was confirmed that only a transparent conductive film exhibiting a high haze (particularly, high blue haze) and inferior transparency could be obtained. In addition, according to the description of Example 7 of Japanese Unexamined Patent Application Publication No. 6-203658, the transparent conductive film obtainable from the coating liquid for forming a transparent conductive film has satisfactory transparency (haze value=0.0%), while the transparent conductive film obtainable from the coating liquid for forming a transparent conductive film of Comparative Example 15 has inferior transparency (haze value=2.63%). Thus, although equivalent coating liquids for forming a transparent conductive film were used, different results were obtained. The reason for this is that in Examples and Comparative Examples of the present invention, since baking is carried out in an air atmosphere (dew point temperature: 15° C. to 20° C.) simulating summer season with high humidity in the atmosphere (high dew point temperature), densification of the transparent conductive films were inhibited, and transparency was deteriorated (large haze values).

When respective Examples and Comparative Examples are compared (Examples 1 to 13, and Comparative Example 13), all of them are coating liquids for forming a transparent conductive film obtained through highly concentrated solutions that have been heated and dissolved to react. However, it is understood that the coating liquids for forming a transparent conductive film of Examples 1 to 13 that had been heated and dissolved to react at a heating and dissolution temperature of 130° C. to 180° C. for a heating time in a predetermined range, exhibit small changes with time in the viscosity and satisfactory stability, and the transparent conductive films thus obtainable exhibit low haze (particularly, blue haze is not observed) with low resistance.

On the other hand, when the coating liquid for forming a transparent conductive film of Comparative Example 13 that had been heated and dissolved to react at 190° C. for a heating time in a predetermined range was used, it was confirmed that even under constant conditions for heating and dissolution/reaction, due to slight fluctuations of the conditions (fluctuations in the temperature elevation history up to a heating temperature of 190° C., fluctuations in the heating temperature itself caused by fluctuations in temperature control, fluctuations in the temperature distribution within the highly concentrated solution, and the like), a transparent conductive film exhibiting a high haze (particularly, high blue haze) and inferior transparency could be obtained; the change with time in the viscosity of the coating liquid for forming a transparent conductive film was large so that the coating liquid exhibited poor stability and eventually underwent gelation (purination); or it was difficult to obtain a coating liquid for forming a transparent conductive film having a satisfactory product quality, and it was not practical.

Here, in regard to the method for producing a coating liquid for forming a transparent conductive film in which components such as indium acetylacetonate and hydroxypropylcellulose are dissolved in an organic solvent as described in Japanese Unexamined Patent Application Publication No. 6-203658 or WO 2010/064719 A1, since the method is carried out by heating at 160° C. for 1 hr (Japanese Unexamined Patent Application Publication No. 6-203658), or heating at 130° C. for 1.5 hr (WO 2010/064719 A1) (the heating time is shorter than a predetermined heating time), which deviates from the appropriate conditions for heating and dissolution/reaction characterized in the present invention (a heating and dissolution temperature of 130° C. to 180° C. with a predetermined range of heating time). Thereby, as can be seen from a comparison between Example 15 and Comparative Example 15 as described above, in summer season in which the humidity in the atmosphere is high (high dew point temperature), and it is difficult to obtain a dense transparent conductive film, since denseness of the transparent conductive film is deteriorated, it cannot be expected to obtain a high performance transparent conductive film having high transparency (particularly, low blue haze), low resistance, excellent stability with time against resistance, and high film strength.

According to the method for producing a coating liquid for forming a transparent conductive film of the present invention, since a coating liquid for forming a transparent conductive film having a stabilized product quality can be obtained at low cost by a convenient production process in a short time, a transparent conductive film having both transparency and high electrical conductivity can be formed on a substrate by a wet-coating method such as a spin coating method or a dip coating method, using the coating liquid for forming a transparent conductive film of the present invention. Also, this transparent conductive film can be expected to be used in display element transparent conductive electrodes for various displays, and transparent electrodes for touch panels, solar cells, field emission lamps and the like.

The invention claimed is:
1. A method for producing a coating liquid for forming a transparent conductive film, the method comprising:
heating and dissolving indium acetylacetonate, a dopant organometallic compound, and a cellulose derivative as an organic viscosity-adjusting agent in a high boiling point organic solvent that contains at least an alkylphenol and a dibasic acid ester, the high boiling point organic solvent having a boiling point of 180° C. or higher, the heating and dissolving being carried out while stirring and allowing the compounds to react, and thereby obtaining a highly concentrated solution, a total content of the indium acetylacetonate and the dopant organometallic compound in the highly concentrated solution is 20% to 60% by weight, and a content of the cellulose derivative is 1/20 to 1/3 of the total content by weight of the indium acetylacetonate and the dopant organometallic compound; and
diluting the highly concentrated solution with any one or more of a medium boiling point organic solvent having a boiling point higher than or equal to 100° C. and lower than 180° C. and a low boiling point organic solvent having a boiling point higher than or equal to 50° C. and lower than 100° C., thereby obtaining the coating liquid;
applying the coating liquid on a substrate;
drying the coating liquid by maintaining the substrate at a temperature of 80° C. to 180° C. for about 5 minutes to 20 minutes to produce a dried coating film; and
performing a baking process consisting of heating the substrate with the dried coating film in air at 300° C. to 500° C. and maintaining for 15 minutes to 60 minutes, wherein:

the any one or more of the organic solvents selected from a medium boiling point organic solvent and a low boiling point organic solvent is a ketone-based organic solvent;

conditions of the heating and dissolution step are such that a heating temperature T in ° C. is in the range of 130° C.≤T≤180° C., and a heating time L in hours is in the range of −0.7T+104<L<−1.1T+168 where 130° C.≤T<140° C., −0.3T+48<L<−0.6T+98 where 140° C.≤T<150° C., −0.15T+25.5<L<−0.4T+68 where 150° C.≤T<160° C., −0.1T+17.5<L<−0.2T+36 where 160° C.≤T<170° C., or −0.025T+4.75<L<−0.1T+19 where 170° C.≤T≤180° C.; and wherein the coating liquid has a degree of viscosity change of from 0.5 times to 1.5 times an initial viscosity if left to stand for three months at room temperature.

2. The method for producing a coating liquid for forming a transparent conductive film according to claim 1, wherein the content ratio of the indium acetylacetonate and the dopant organometallic compound is such that the molar ratio of indium acetylacetonate/dopant organometallic compound is 99/1 to 87/13.

3. The method for producing a coating liquid for forming a transparent conductive film according to claim 2, wherein the total content of the indium acetylacetonate and the dopant organometallic compound in the coating liquid for forming a transparent conductive film is 5% to 15% by weight.

4. The method for producing a coating liquid for forming a transparent conductive film according to claim 1, wherein the dopant organometallic compound is tin acetylacetonate.

5. The method for producing a coating liquid for forming a transparent conductive film according to claim 1, wherein the cellulose derivative is hydroxypropylcellulose.

6. The method for producing a coating liquid for forming a transparent conductive film according to claim 1, wherein the alkylphenol is para-tertiary butylphenol.

7. The method for producing a coating liquid for forming a transparent conductive film according to claim 1, wherein the dibasic acid ester is any one or more of dimethyl malonate, dimethyl succinate, dimethyl glutarate, and dimethyl adipate.

8. The method for producing a coating liquid for forming a transparent conductive film according to claim 1, wherein the ketone-based organic solvent is any one or more of cyclohexanone and methyl ethyl ketone.

9. A method for producing a coating liquid for forming a transparent conductive film, the method comprising:

heating and dissolving indium acetylacetonate, a dopant organometallic compound and a cellulose derivative as an organic viscosity-adjusting agent in a high boiling point organic solvent that contains at least an alkylphenol and a dibasic acid ester, the high boiling point organic solvent having a boiling point of 180° C. or higher, the heating and dissolving being carried out while stirring and allowing the compounds to react, and thereby obtaining a highly concentrated solution, a total content of the indium acetylacetonate and the dopant organometallic compound in the highly concentrated solution is 20% to 60% by weight, and a content of the cellulose derivative is 1/20 to 1/3 of the total content by weight of the indium acetylacetonate and the dopant organometallic compound; and diluting the highly concentrated solution with any one or more of a medium boiling point organic solvent having a boiling point higher than or equal to 100° C. and lower than 180° C. and a low boiling point organic solvent having a boiling point higher than or equal to 50° C. and lower than 100° C.;

applying the coating liquid on a substrate;

drying the coating liquid by maintaining the substrate at a temperature of 80° C. to 180° C. for about 5 minutes to 20 minutes to produce a dried coating film; and performing a baking process consisting of heating the substrate with the dried coating film in air at 300° C. to 500° C. and maintaining for 15 minutes to 60 minutes, wherein:

any one or more of the organic solvents selected from a medium boiling point organic solvent and a low boiling point organic solvent is a ketone-based organic solvent;

a heating temperature T in ° C. of the heating and dissolution step is in the range of 130° C.≤T≤180° C., while a heating time L in hours satisfies the following Equation (1); and the heating time is regulated so that a degree of viscosity change in a case in which the coating liquid for forming a transparent conductive film is left to stand for three months at room temperature is from 0.5 times to 1.5 times the initial viscosity:

$$L > \begin{cases} -0.7\,T + 104 & \text{where } 130 \leq T < 140° \text{ C.} \\ -0.3\,T + 48 & \text{where } 140 \leq T < 150° \text{ C.} \\ -0.15\,T + 25.5 & \text{where } 150 \leq T < 160° \text{ C.} \\ -0.1\,T + 17.5 & \text{where } 160 \leq T < 170° \text{ C.} \\ -0.025\,T + 4.75 & \text{where } 170 \leq T \leq 180° \text{ C.} \end{cases} \quad [\text{Equation 1}]$$

10. The method for producing a coating liquid for forming a transparent conductive film according to claim 9, wherein the content ratio of the indium acetylacetonate and the dopant organometallic compound is such that the molar ratio of indium acetylacetonate/dopant organometallic compound is 99/1 to 87/13.

11. The method for producing a coating liquid for forming a transparent conductive film according to claim 10, wherein the total content of the indium acetylacetonate and the dopant organometallic compound in the coating liquid for forming a transparent conductive film is 5% to 15% by weight.

12. The method for producing a coating liquid for forming a transparent conductive film according to claim 9, wherein the dopant organometallic compound is tin acetylacetonate.

13. The method for producing a coating liquid for forming a transparent conductive film according to claim 9, wherein the cellulose derivative is hydroxypropylcellulose.

14. The method for producing a coating liquid for forming a transparent conductive film according to claim 9, wherein the alkylphenol is para-tertiary butylphenol.

15. The method for producing a coating liquid for forming a transparent conductive film according to claim 9, wherein the dibasic acid ester is any one or more of dimethyl malonate, dimethyl succinate, dimethyl glutarate, and dimethyl adipate.

16. The method for producing a coating liquid for forming a transparent conductive film according to claim 9, wherein the ketone-based organic solvent is any one or more of cyclohexanone and methyl ethyl ketone.

17. A method for producing a coating liquid for forming a transparent conductive film, the method comprising:

admixing indium acetylacetonate, a dopant organometallic compound, and an organic viscosity-adjusting agent in a high boiling point organic solvent;

the dopant organometallic compound comprising a metal selected from tin, titanium, germanium, zinc, tungsten, zirconium, tantalum, niobium, hafnium, vanadium, and a mixture thereof;

the organic viscosity-adjusting agent including a cellulose derivative;

the high boiling organic solvent having a boiling point of 180° C. or higher and contains at least an alkylphenol and a dibasic acid ester;

heating and stirring the admixture for a time L in hours at a temperature T in ° C. in the range of 130° C. to 180° C., where when 130° C.$\leq$T<140° C.: $-0.7T+104<L<-1.1T+168$,
140° C.$\leq$T<150° C.: $-0.3T+48<L<-0.6T+98$,
150° C.$\leq$T<160° C.: $-0.15T+25.5<L<-0.4T+68$,
160° C.$\leq$T<170° C.: $-0.1T+17.5<L<-0.2T+36$, and
170° C.$\leq$T$\leq$180° C.: $-0.025T+4.75<L<-0.1T+19$;

forming a highly concentrated solution that has 20% to 60% by weight of indium acetylacetonate and the dopant organometallic compound, the highly concentrated solution having a content of the organic viscosity-adjusting agent that is $\frac{1}{20}$ to $\frac{1}{3}$ of a total content by weight of the indium acetylacetonate and the dopant organometallic compound; then diluting the highly concentrated solution with any one or more of a medium boiling point organic solvent having a boiling point higher than or equal to 100° C. and lower than 180° C. and a low boiling point organic solvent having a boiling point: higher than or equal to 50° C. and lower than 100° C., where any one or more of the medium boiling point organic solvent and the low boiling point organic solvent is a ketone-based organic solvent, thereby forming the coating liquid;

applying the coating liquid on a substrate;

drying the coating liquid by maintaining the substrate at a temperature of 80° C. to 180° C. for about 5 minutes to 20 minutes to produce a dried coating film; and performing a baking process consisting of heating the substrate with the dried coating film in air at 300° C. to 500° C. and maintaining for 15 minutes to 60 minutes, wherein the coating liquid has an initial viscosity that changes less than ±50% after being left to stand at room temperature for three months.

* * * * *